US012744003B2

(12) United States Patent
Heo et al.

(10) Patent No.: US 12,744,003 B2
(45) Date of Patent: Sep. 22, 2026

(54) DISPLAY DEVICE

(71) Applicant: SAMSUNG DISPLAY CO., LTD., Yongin-si (KR)

(72) Inventors: Ji Hye Heo, Yongin-si (KR); Seung Woo Sung, Yongin-si (KR); Na Ra On, Yongin-si (KR); Yun Kyeong In, Yongin-si (KR); Su Kyo Jung, Yongin-si (KR); Seung Han Jo, Yongin-si (KR); Jun Young Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 19/060,936

(22) Filed: Feb. 24, 2025

(65) Prior Publication Data

US 2025/0384830 A1 Dec. 18, 2025

(30) Foreign Application Priority Data

Jun. 17, 2024 (KR) ........................ 10-2024-0078149

(51) Int. Cl.
*G09G 5/00* (2006.01)
*G09G 3/3233* (2016.01)
(Continued)

(52) U.S. Cl.
CPC ......... *G09G 3/3233* (2013.01); *H10K 59/121* (2023.02); *H10K 59/131* (2023.02);
(Continued)

(58) Field of Classification Search
CPC ......... G09G 3/3233; G09G 2300/0426; G09G 2300/0804; G09G 2300/0819;
(Continued)

(56) References Cited

U.S. PATENT DOCUMENTS 10,437,974 B2 10/2019 He et al.
12,057,066 B2 8/2024 An et al.
(Continued)

FOREIGN PATENT DOCUMENTS

CN 115346481 A 11/2022
EP 4436343 A1 9/2024
(Continued)

OTHER PUBLICATIONS

Extended European Search Report issued in corresponding Application No. EP 25174018.9 on Oct. 29, 2025.

*Primary Examiner* — Jennifer T Nguyen
(74) *Attorney, Agent, or Firm* — F. CHAU & ASSOCIATES, LLC

(57) ABSTRACT

A display device includes: a substrate with a display area having emission areas and a surrounding non-display area, a circuit layer on the substrate, and an element layer on the circuit layer. The display area includes a main display area with emission areas arranged side by side and at least one sub-display area surrounded by the main display area. Each sub-display area includes light transmission areas between emission areas. The element layer has main light-emitting elements in the main display area's emission areas and sub-light-emitting elements in the sub-display area's emission areas. The circuit layer includes main pixel drivers connected to the main light-emitting elements, sub-pixel drivers connected to the sub-light-emitting elements, a main anode initialization voltage line for initializing main light-emitting elements and a sub-anode initialization voltage line for initializing sub-light-emitting elements.

20 Claims, 19 Drawing Sheets

(51) Int. Cl.
*H10K 59/121* (2023.01)
*H10K 59/131* (2023.01)

(52) U.S. Cl.
CPC ............... *G09G 2300/0426* (2013.01); *G09G 2300/0804* (2013.01); *G09G 2300/0819* (2013.01); *G09G 2300/0852* (2013.01); *G09G 2300/0861* (2013.01); *G09G 2320/0233* (2013.01); *G09G 2320/0242* (2013.01); *G09G 2320/0686* (2013.01); *G09G 2360/14* (2013.01)

(58) Field of Classification Search
CPC ... G09G 2300/0852; G09G 2300/0861; G09G 2320/0233; G09G 2320/0242; G09G 2320/0686; G09G 2360/14; H10K 59/131; H10K 59/121
USPC .......................................................... 345/206
See application file for complete search history.

(56) References Cited

U.S. PATENT DOCUMENTS

| | | | | |
|---|---|---|---|---|
| 12,165,592 | B2 | 12/2024 | Bang et al. | |
| 2022/0077265 | A1* | 3/2022 | Ma ....................... | G09G 3/3233 |
| 2022/0366847 | A1* | 11/2022 | An ....................... | G09G 3/2003 |
| 2023/0079023 | A1 | 3/2023 | Lee et al. | |
| 2023/0189596 | A1 | 6/2023 | Huang et al. | |
| 2024/0099084 | A1 | 3/2024 | Liu et al. | |
| 2024/0395210 | A1 | 11/2024 | An et al. | |
| 2025/0104637 | A1 | 3/2025 | Bang et al. | |
| 2026/0020453 | A1* | 1/2026 | Li ....................... | H10K 59/131 |

FOREIGN PATENT DOCUMENTS

| | | | |
|---|---|---|---|
| KR | 10-2023-0041152 | A | 3/2023 |
| KR | 10-2024-0023367 | A | 2/2024 |

* cited by examiner

FIG. 6

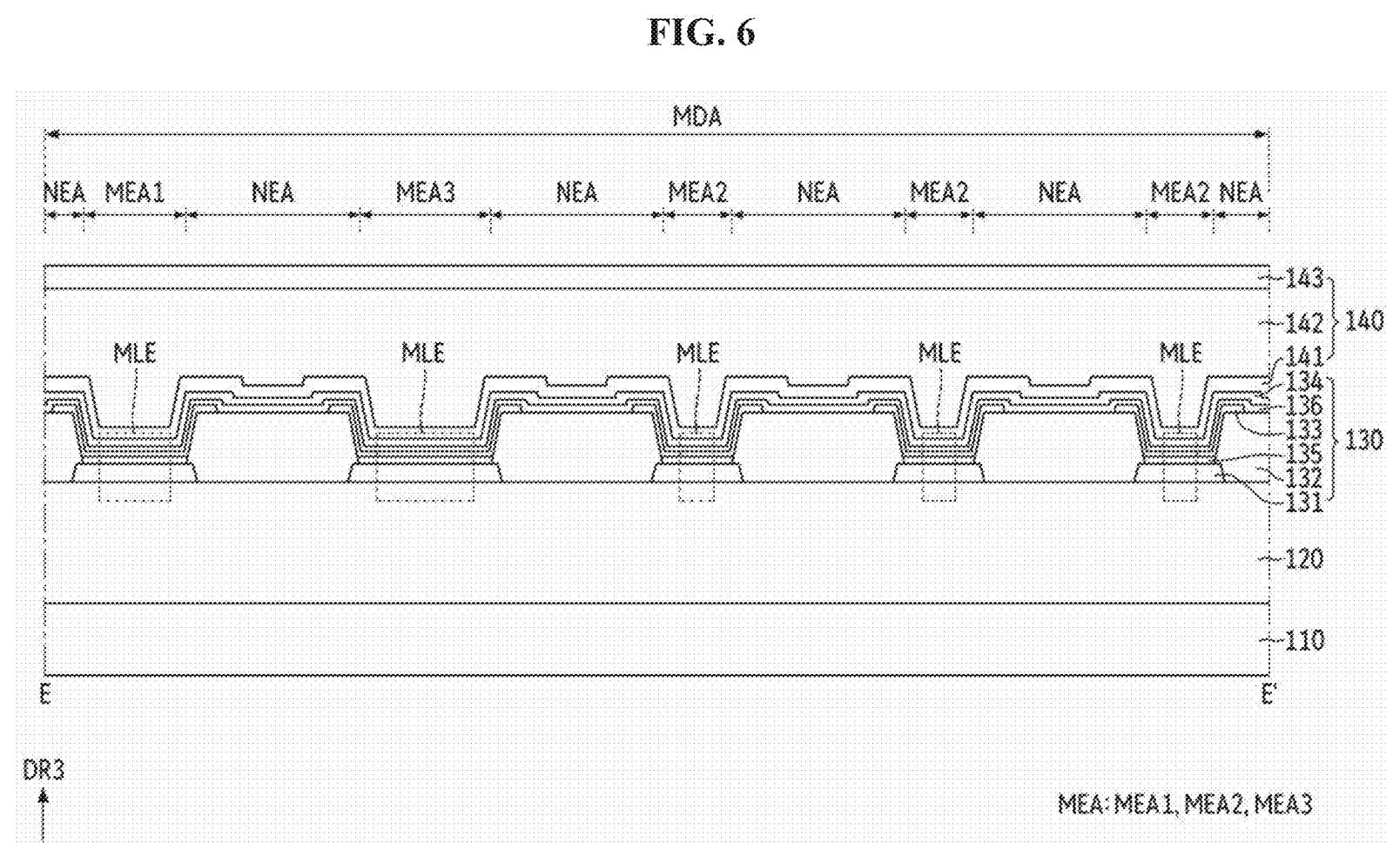

MDA

NEA MEA1 NEA MEA3 NEA MEA2 NEA MEA2 NEA MEA2 NEA

MLE 143 142 141 140 134 136 133 135 132 131 130 120 110

E E'

DR3

MEA: MEA1, MEA2, MEA3

DISPLAY DEVICE

CROSS-REFERENCE TO RELATED APPLICATION

This application claims priority under 35 U.S.C. § 119 to Korean Patent Application No. 10-2024-0078149 filed on Jun. 17, 2024 in the Korean Intellectual Property Office, the disclosure of which is incorporated by reference herein in its entirety.

1. TECHNICAL FIELD

The present disclosure relates to a display device.

2. DESCRIPTION OF THE RELATED ART

With the advancement of the information-oriented society, the demand for display devices capable of presenting images in diverse ways continues to grow. For example, display devices are now integral components of various electronic devices such as smartphones, digital cameras, laptop computers, navigation systems, and smart televisions.

Display devices may include flat panel types such as liquid crystal display devices, field emission display devices and light emitting display devices. Examples of the light emitting display devices may include an organic light emitting display device including organic light emitting elements, an inorganic light emitting display device including inorganic light emitting elements such as inorganic semiconductors, and a micro light emitting display device including micro light emitting elements.

The organic light emitting display device generates images using light emitting elements, each including a light emitting layer made of an organic light emitting material. As a self-emissive technology, the organic light emitting display device offers advantages such as lower power consumption, faster response speed, higher luminous efficiency, improved brightness, and a wider viewing angle compared to other types of display devices.

One surface of the display device may include a display surface that includes a display area, where images are shown, and a non-display area surrounding the display area. Within the display area, emission areas emitting light at various luminances and colors may be arranged.

SUMMARY

Display devices can be designed in various configurations to suit different types of electronic devices.

For example, a display device tailored to an electronic device including an optical device, such as a smartphone or a tablet device, may include a hole overlapping the optical device. Light incident through such a hole may be detected by a camera sensor.

However, this design introduces a challenge: the display area's ratio on the display surface decreases as the non-display area's width increases due to the hole's presence.

In view of the foregoing, embodiments of the present disclosure provide a display device that eliminates the need for a hole overlapping the optical device, allowing it to be integrated into an electronic device while maintaining a proper ratio of a display area in a display surface.

According to an embodiment of the present disclosure, there is provided a display device including: a substrate including a display area including emission areas and a non-display area disposed around the display area; a circuit layer disposed on the substrate; and an element layer disposed on the circuit layer, wherein the display area includes a main display area in which the emission areas are arranged side by side, and at least one sub-display area surrounded by the main display area, each of the at least one sub-display area further includes light transmission areas disposed between the emission areas, the element layer includes: main light emitting elements disposed in the emission areas of the main display area; and sub-light emitting elements disposed in the emission areas of the at least one sub-display area, and the circuit layer includes: main light emitting pixel drivers electrically connected to the main light emitting elements; sub-light emitting pixel drivers electrically connected to the sub-light emitting elements; a main anode initialization voltage line disposed in the main display area and configured to transmit a main anode initialization voltage for initializing the main light emitting elements; and a sub-anode initialization voltage line disposed in the at least one sub-display area and configured to transmit a sub-anode initialization voltage for initializing the sub-light emitting elements.

The sub-anode initialization voltage has a voltage level different from the main anode initialization voltage.

A width of each of the sub-light emitting elements is greater than a width of each of the main light emitting elements, and the sub-anode initialization voltage has a voltage level lower than the main anode initialization voltage.

The circuit layer further includes: a main anode initialization voltage supply line disposed in the non-display area and electrically connected to the main anode initialization voltage line; and a sub-anode initialization voltage supply line disposed in the non-display area and configured to transmit the sub-anode initialization voltage.

The circuit layer further includes: a sub-anode initialization voltage outer line extending along an edge of the at least one sub-display area; and at least one sub-anode initialization voltage connection line electrically connecting the sub-anode initialization voltage supply line to the sub-anode initialization voltage outer line.

The circuit layer further includes: a sub-anode initialization voltage transmission line disposed in the at least one sub-display area, extending in a direction intersecting the sub-anode initialization voltage line, and electrically connected to the sub-anode initialization voltage outer line and the sub-anode initialization voltage line.

The circuit layer further includes: a sub-anode initialization voltage additional line disposed in the at least one sub-display area, extending in a direction intersecting the sub-anode initialization voltage transmission line, and electrically connected to the sub-anode initialization voltage transmission line.

The circuit layer further includes: data lines for transmitting a data signal; first auxiliary lines extending in a first direction intersecting the data lines; and second auxiliary lines extending in a second direction parallel to the data lines and adjacent to the data lines, wherein the first auxiliary lines include the sub-anode initialization voltage additional line.

The second auxiliary lines include the at least one sub-anode initialization voltage connection line.

The first auxiliary lines further include the at least one sub-anode initialization voltage connection line.

The display device further includes a display driving circuit for outputting data signals of the data lines, wherein a bypass area on one side of the main display area includes a bypass middle area, a first bypass side area parallel to the bypass middle area in the first direction and adjacent to the non-display area, and a second bypass side area disposed between the bypass middle area and the first bypass side area, the circuit layer further includes data supply lines disposed in the non-display area, extending to the bypass middle area or the second bypass side area, and electrically connected to the display driving circuit, the data lines include a first data line disposed in the first bypass side area, and a second data line disposed in the second bypass side area, the first auxiliary lines further include a first data bypass line electrically connected to the first data line, the second auxiliary lines include a second data bypass line adjacent to the second data line and electrically connected to the first data bypass line, a first data supply line, which transmits a data signal of the first data line among the data supply lines, is electrically connected to the first data line through the first data bypass line and the second data bypass line, and a second data supply line, which transmits a data signal of the second data line among the data supply lines, is directly electrically connected to the second data line.

One of the main light emitting pixel drivers is electrically connected to one of the main light emitting elements, and the one main light emitting pixel driver includes: a first transistor for generating a driving current; a second transistor electrically connected between a data line for transmitting a data signal and a first electrode of the first transistor; a third transistor electrically connected between a gate electrode of the first transistor and a second electrode of the first transistor; a fourth transistor electrically connected between a gate initialization voltage line for transmitting a gate initialization voltage and the gate electrode of the first transistor; a fifth transistor electrically connected between a first power line for transmitting a first power source and the first electrode of the first transistor; a sixth transistor electrically connected between the second electrode of the first transistor and the one main light emitting element; a seventh transistor electrically connected between the main anode initialization voltage line and the one main light emitting element; and an eighth transistor electrically connected between a bias voltage line for transmitting a bias voltage and the first electrode of the first transistor.

One of the sub-light emitting pixel drivers is electrically connected to one of the sub-light emitting elements, and the one sub-light emitting pixel driver includes: a first transistor for generating a driving current; a second transistor electrically connected between a data line for transmitting a data signal and a first electrode of the first transistor; a third transistor electrically connected between a gate electrode of the first transistor and a second electrode of the first transistor; a fourth transistor electrically connected between a gate initialization voltage line for transmitting a gate initialization voltage and the gate electrode of the first transistor; a fifth transistor electrically connected between a first power line for transmitting a first power source and the first electrode of the first transistor; a sixth transistor electrically connected between the second electrode of the first transistor and the one sub-light emitting element; a seventh transistor electrically connected between the sub-anode initialization voltage line and the one sub-light emitting element; and an eighth transistor electrically connected between a bias voltage line for transmitting a bias voltage and the first electrode of the first transistor.

The emission areas include: a first emission area for emitting light in a first wavelength band; a second emission area for emitting light in a second wavelength band lower than the first wavelength band; and a third emission area for emitting light in a third wavelength band lower than the second wavelength band, the main anode initialization voltage line includes: a first main anode initialization voltage line configured to transmit a first main anode initialization voltage for initializing the main light emitting element of the first emission area and the main light emitting element of the third emission area; and a second main anode initialization voltage line configured to transmit a second main anode initialization voltage for initializing the main light emitting element of the second emission area, and the sub-anode initialization voltage line includes: a first sub-anode initialization voltage line configured to transmit a first sub-anode initialization voltage for initializing the sub-light emitting element of the first emission area and the sub-light emitting element of the third emission area; and a second sub-anode initialization voltage line configured to transmit a second sub-anode initialization voltage for initializing the sub-light emitting element of the second emission area.

According to an embodiment of the present disclosure, there is provided a display device including: a substrate including a display area and a non-display area disposed around the display area, wherein the display area includes emission areas; a circuit layer disposed on the substrate; and an element layer disposed on the circuit layer, wherein the display area includes a main display area and at least one sub-display area surrounded by the main display area, wherein the emission areas are included in the main display area, the at least one sub-display area further includes light transmission areas disposed between the emission areas, the element layer includes: main light emitting elements disposed in the emission areas of the main display area; and sub-light emitting elements disposed in the emission areas of the at least one sub-display area, and the circuit layer includes: main light emitting pixel drivers electrically connected to the main light emitting elements; sub-light emitting pixel drivers electrically connected to the sub-light emitting elements; a main anode initialization voltage line disposed in the main display area and configured to transmit a main anode initialization voltage for initializing the main light emitting elements; a sub-anode initialization voltage line disposed in the at least one sub-display area and configured to transmit a sub-anode initialization voltage for initializing the sub-light emitting elements; a main anode initialization voltage supply line disposed in the non-display area and electrically connected to the main anode initialization voltage line; a sub-anode initialization voltage supply line disposed in the non-display area and configured to transmit the sub-anode initialization voltage; a sub-anode initialization voltage outer line extending along an edge of the at least one sub-display area; and at least one sub-anode initialization voltage connection line electrically connecting the sub-anode initialization voltage supply line to the sub-anode initialization voltage outer line.

The circuit layer further includes: a sub-anode initialization voltage transmission line disposed in the at least one sub-display area, extending in a direction intersecting the sub-anode initialization voltage line, and electrically connected to the sub-anode initialization voltage outer line and the sub-anode initialization voltage line; and a sub-anode initialization voltage additional line disposed in the at least one sub-display area, extending in a direction intersecting the sub-anode initialization voltage transmission line, and electrically connected to the sub-anode initialization voltage transmission line.

The circuit layer further includes: data lines for transmitting a data signal to the main light emitting pixel drivers and the sub-light emitting pixel drivers; first auxiliary lines extending in a first direction intersecting the data lines; and second auxiliary lines extending in a second direction parallel to the data lines and adjacent to their respective data lines, wherein the first auxiliary lines comprise the sub-anode initialization voltage additional line.

The display device further includes a display driving circuit for outputting data signals of the data lines, wherein a bypass area on one side of the display area includes a bypass middle area, a first bypass side area parallel to the bypass middle area in the first direction and adjacent to the non-display area, and a second bypass side area disposed between the bypass middle area and the first bypass side area, the circuit layer further includes data supply lines disposed in the non-display area, extending to the bypass middle area or the second bypass side area, and electrically connected to the display driving circuit, the data lines include a first data line disposed in the first bypass side area, and a second data line disposed in the second bypass side area, the first auxiliary lines further include a first data bypass line electrically connected to the first data line, the second auxiliary lines include a second data bypass line adjacent to the second data line and electrically connected to the first data bypass line, a first data supply line, which transmits a data signal of the first data line among the data supply lines, is electrically connected to the first data line through the first data bypass line and the second data bypass line, and a second data supply line, which transmits a data signal of the second data line among the data supply lines, is directly electrically connected to the second data line.

The second auxiliary lines include the at least one sub-anode initialization voltage connection line.

The first auxiliary lines further include the at least one sub-anode initialization voltage connection line.

According to an embodiment of the present disclosure, there is provided an electronic device including: a display device including: a substrate including a display area including emission areas and a non-display area disposed around the display area; a circuit layer disposed on the substrate; and an element layer disposed on the circuit layer, wherein the display area includes a main display area in which the emission areas are arranged side by side, and at least one sub-display area surrounded by the main display area, each of the at least one sub-display area further includes light transmission areas disposed between the emission areas, the element layer includes: main light emitting elements disposed in the emission areas of the main display area; and sub-light emitting elements disposed in the emission areas of the at least one sub-display area, and the circuit layer includes: main light emitting pixel drivers electrically connected to the main light emitting elements; sub-light emitting pixel drivers electrically connected to the sub-light emitting elements; a main anode initialization voltage line disposed in the main display area and configured to transmit a main anode initialization voltage for initializing the main light emitting elements; and a sub-anode initialization voltage line disposed in the at least one sub-display area and configured to transmit a sub-anode initialization voltage for initializing the sub-light emitting elements.

As described above, according to the embodiments, the display area of the substrate includes the at least one sub-display area in which the emission areas and the light transmission areas are arranged.

Light can pass through the light transmission areas of the sub-display area to a space beneath the substrate. This allows an optical device located under the substrate to function effectively, even if it overlaps with the sub-display area.

Therefore, the display device according to the embodiments eliminates the need for a hole overlapping the optical device while still enabling the optical device to operate via the sub-display area. This makes the display device suitable for integration into electronic devices that include optical components.

According to the embodiments, a sub-anode initialization voltage may have a different voltage level from a main anode initialization voltage.

In other words, since the circuit layer further includes a sub-anode initialization voltage line in addition to a main anode initialization voltage line, the sub-anode initialization voltage that is different from the main anode initialization voltage may be transmitted to sub-light emitting pixels.

In this configuration, even if the sub-light emitting elements differ in size from the main light emitting elements, the sub-light emitting elements may be initialized by the sub-anode initialization voltage. This ensures that the sub-light emitting elements may emit light with a luminance similar to the luminance of light emitted from the main light emitting elements. Accordingly, even if the display device includes the at least one sub-display area, deterioration of display quality due to the presence of the at least one sub-display area may be reduced or prevented.

For example, if the width of each of the sub-light emitting elements is greater than the width of each of the main emitting elements to lower the visibility of the light transmission areas, the sub-anode initialization voltage may have a lower voltage level than the main anode initialization voltage.

However, the effects described above are merely examples, and various other effects and advantages are encompassed within the scope of the embodiments of the present disclosure.

BRIEF DESCRIPTION OF THE DRAWINGS

The above and other features of the present disclosure will become more apparent by describing in detail embodiments thereof with reference to the attached drawings, in which:

FIG. 6 is a cross-sectional view taken along line E-E' of FIG. 5;

FIG. 14 is a layout diagram illustrating part G of FIG. 13;

FIGS. 17, 18, and 19 are layout diagrams illustrating part I of FIG. 13 according to other embodiments.

DETAILED DESCRIPTION OF THE EMBODIMENTS

Figure 1:
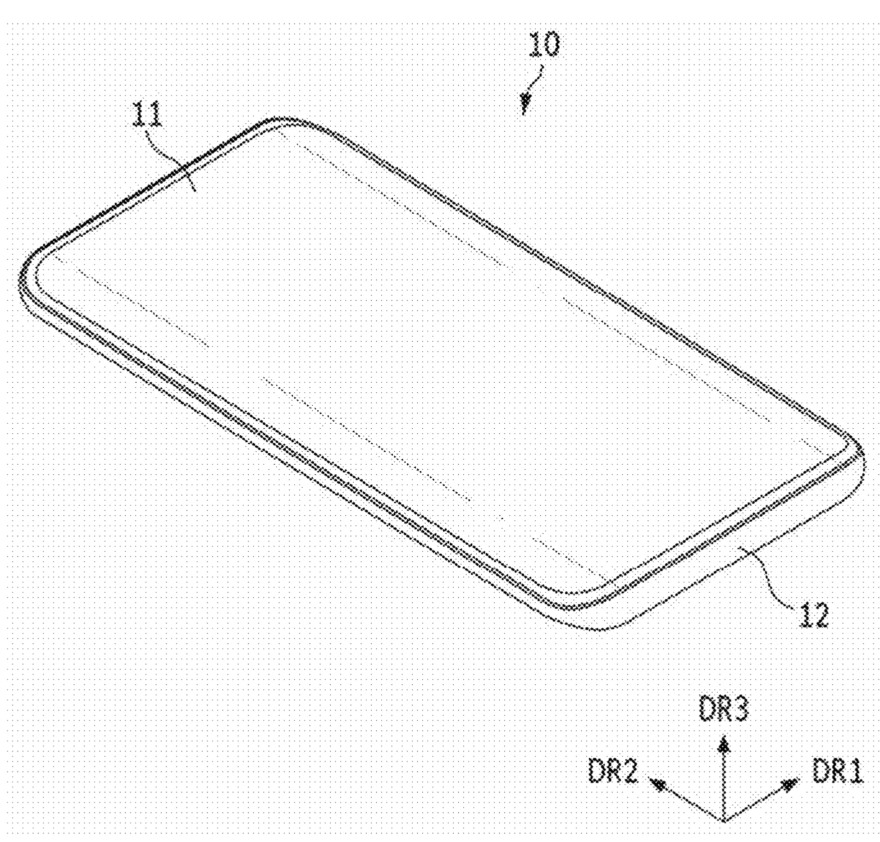
FIG. 1 is a perspective view showing an electronic device according to embodiments.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Certain components not directly relevant to the description have been omitted to focus on the embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" may mean when an object portion is viewed from above, and the phrase "in a schematic cross-sectional view" may mean when a schematic cross-section taken by vertically cutting an object portion is viewed from the side. The terms "overlap" or "overlapped" may mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include the meaning such as "apart from" or "set aside from" or "offset from" and any other suitable equivalents as would be appreciated and understood by those of ordinary skill in the art. The terms "face" and "facing" may mean that a first object may directly or indirectly opposes a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for case of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that the terms "first," "second," "third," or the like may be used herein to distinguish one element from another element or for the ease of description and explanation. For example, when "a first element" is discussed in the description, it may be termed "a second element" or "a third element," and "a second element" and "a third element" may be termed in a similar manner without departing from the scope of teachings of the present disclosure.

The terms "about" or "approximately" as used herein is inclusive of the stated value and may mean within an acceptable range of deviation for the particular value as determined by one of ordinary skill in the art, considering the measurement in question and the error associated with the measurement of the particular quantity (for example, the limitations of the measurement system). For example, "about" may mean within one or more standard deviations, or within +30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

The present disclosure relates to a display device that integrates advanced features to support underlying optical devices without compromising the display's structure or quality. The device comprises a substrate with a display area featuring emission and light transmission areas, and a non-display area surrounding it. The display area includes a main display area, where emission areas are arranged side by side, and at least one sub-display area, which incorporates light transmission areas between the emission zones. These transmission areas enable light to pass through the display, allowing an optical device below the substrate to function without requiring a hole in the display.

The display incorporates an element layer with distinct main and sub-light emitting elements and a circuit layer featuring pixel drivers and voltage lines. Separate initialization voltage lines for the main and sub-light emitting elements ensure optimal performance by adjusting voltage levels based on the size of the emitting elements, maintaining uniform luminance. This design allows the display to deliver high-quality visuals while supporting the operation of optical devices underneath. By eliminating the need for physical interruptions like holes, the present disclosure ensures better aesthetics and compatibility for devices such as smartphones or advanced electronics with integrated optical components.

Hereinafter, embodiments of the present disclosure will be described with reference to the accompanying drawings.

Figure 2:
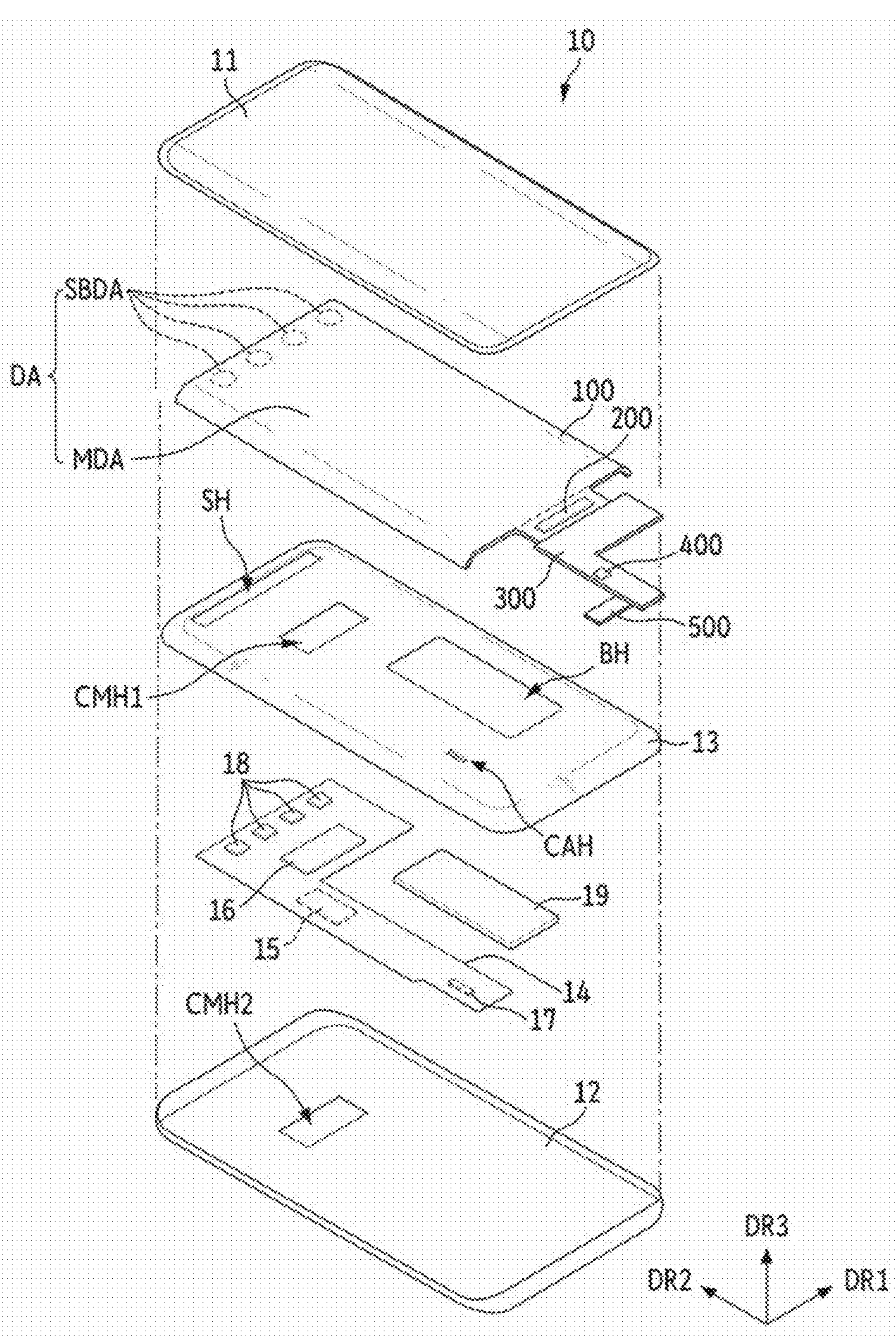
FIG. 2 is an exploded perspective view showing the electronic device of FIG. 1.

FIG. 1 is a perspective view showing an electronic device according to embodiments. FIG. 2 is an exploded perspective view showing the electronic device of FIG. 1.

Referring to FIG. 1, an electronic device 10 according to embodiments is a device having a function of displaying an image in a display area. The electronic device 10 may provide portability. For example, the electronic device 10 may be a portable electronic device such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

However, the electronic device 10 according to embodiments is not limited to a portable electronic device, and may be a large-sized device such as a television, a laptop computer, a monitor, a billboard, and an Internet-of-Things (IoT) device.

The electronic device 10 may include a cover window 11 and a lower cover 12 provided as a housing for protecting a display device 100 (see FIG. 2).

Referring to FIG. 2, the electronic device 10 according to embodiments may further include the display device 100, a bracket 13, at least one optical device 18, and a main circuit board 14 accommodated between the cover window 11 and the lower cover 12.

Hereinafter, a first direction DR1 may be a direction parallel to the short side of the electronic device 10 in a plan view, in other words, a widthwise direction of the electronic device 10. A second direction DR2 may be a direction parallel to the long side of the electronic device 10 in a plan view, in other words, a lengthwise direction of the electronic device 10. A third direction DR3 may be a thickness direction of the electronic device 10.

The electronic device 10 may have a rectangular shape in the plane in the first direction DR1 and the second direction DR2. For example, the electronic device 10 may have a rectangular shape, in a plan view, having a short side in the first direction DR1 and a long side in the second direction DR2. A corner where the short side in the first direction DR1 and the long side in the second direction DR2 meet may be right-angled or rounded with a predetermined curvature. The planar shape of the electronic device 10 is not limited to the rectangular shape, and may be formed in another polygonal shape, a circular shape or an elliptical shape.

The electronic device 10 may include a display surface on which a display area DA where an image display is implemented is disposed.

The display device 100 may include the display area DA that emits light toward the display surface of the electronic device 10.

The display area DA may include a main display area MDA disposed in most of the display area DA, and the at least one sub-display area SBDA surrounded by the main display area MDA.

The at least one sub-display area SBDA may overlap the at least one optical device 18.

The display device 100 may further include a display driving circuit 200 disposed in a sub-region SBA, a display circuit board 300 fastened to the edge of the sub-region SBA, a touch driving circuit 400 mounted on the display circuit board 300, and a cable 500 extending from one side of the display circuit board 300.

The cover window 11 may be disposed on the display device 100. Accordingly, one surface of the display device 100 through which light is emitted may be covered with the cover window 11.

In other words, the cover window 11 may serve to protect the top surface of the display device 100.

The cover window 11 may include a light transmitting portion that is transparent and a light blocking portion that is opaque.

The light transmitting portion may overlap the display area DA of the display device 100 in the third direction DR3.

The light blocking portion may be disposed around the light transmitting portion and may overlap the non-display area NDA (see FIG. 3) of the display device 100.

The cover window 11 may include a top surface portion forming the top surface of the electronic device 10, a left side portion forming the left side surface of the electronic device 10, and a right side portion forming the right side surface of the electronic device 10. The left surface portion of the cover window 11 may extend from the left side of the top surface portion, and the right surface portion of the cover window 11 may extend from the right side of the top surface portion.

Each of the top, left, and right surface portions of the cover window 11 may include the light transmitting portion and the light blocking portion.

The light transmitting portion of the cover window 11 may be disposed on most of each of the top, left, and right surface portions of the cover window 11.

The light blocking portion of the cover window 11 may be disposed at the upper edge and lower edge of the top surface portion of the cover window 11, the upper edge, left edge, and lower edge of the left surface portion of the cover window 11, and the upper edge, right edge, and lower edge of the right surface portion of the cover window 11.

The bracket 13 may be disposed under the display device 100.

The bracket 13 may include plastic, metal, or both plastic and metal. The bracket 13 may include a first camera hole CMH1 into which a camera device 16 is inserted, a battery hole BH for holding a battery 19, a light transmission hole SH into which the at least one optical device 18 is inserted, and a cable hole CAH serving as a passage of the cable 500 connected to the display circuit board 300.

The main circuit board 14 and the battery 19 may be disposed under the bracket 13. The main circuit board 14 may be a printed circuit board or a flexible printed circuit board.

A main processor 15, the camera device 16, a main connector 17, and the at least one optical device 18 may be mounted on the main circuit board 14.

The camera device 16 may be disposed on both the top surface and the bottom surface of the main circuit board 14, the main processor 15 may be disposed on the top surface of the main circuit board 14, and the main connector 17 may be disposed on the bottom surface of the main circuit board 14.

The main processor 15 may control all functions of the electronic device 10.

For example, the main processor 15 may output digital video data to the display driving circuit 200 through the display circuit board 300 such that the display device 100 displays an image. In addition, the main processor 15 may receive touch data including a user's touch coordinates from the touch driving circuit 400, determine whether or not the user has touched or approached the electronic device 10, and then perform an operation corresponding to the user's touch input or approach input. For example, the main processor 15 may perform an operation or execute an application indicated by an icon touched by the user.

The main processor 15 may be an application processor formed of an integrated circuit, a central processing unit, or a system chip.

The camera device 16 may process an image frame of a still image or video obtained by an image sensor in a camera mode and output it to the main processor 15.

The cable 500 having passed through the cable hole CAH of the bracket 13 may be connected to the main connector 17. Thus, the main circuit board 14 may be electrically connected to the display circuit board 300.

The at least one optical device 18 may include a proximity sensor, an illumination sensor, an iris sensor, and a second camera sensor.

The proximity sensor, the illumination sensor, the iris sensor, and the second camera sensor may be disposed on the top surface of the main circuit board 14 and in the light transmission hole SH of the bracket 13.

The proximity sensor is a sensor for detecting an object approaching the front surface of the electronic device 10. The proximity sensor may include a light source that outputs light and a light receiver that receives light reflected by an object. The proximity sensor may generate a sensing signal corresponding to the amount of light reflected by the object, and presence or absence of an object near the front surface of the electronic device 10 may be determined based on the sensing signal of the proximity sensor.

The illuminance sensor is a sensor for detecting the brightness of the front surface of the electronic device 10. The illuminance sensor may include a resistor whose resistance value changes according to the brightness of the incident light.

The iris sensor is a sensor for imaging the user's iris. It can be verified whether the user is a pre-registered user based on whether the image captured by the iris sensor is the same as an iris image previously stored in a memory.

The second camera sensor may process an image frame of a still image or video obtained by the image sensor and output it to the main processor 15. The second camera sensor may be a complementary metal-oxide-semiconductor (CMOS) image sensor or a charge-coupled device (CCD) sensor. The number of pixels of the second camera sensor may be smaller than the number of pixels of the camera device 16, and the size of the second camera sensor may be smaller than the size of the camera device 16.

The battery 19 may be spaced apart from the main circuit board 14. In other words, the battery 19 may not overlap the main circuit board 14 in the third direction DR3. The battery 19 may be disposed in the battery hole BH of the bracket 13 in the third direction DR3.

In addition, the main circuit board 14 may be further equipped with a mobile communication module capable of transmitting and receiving radio signals with at least one of a base station, an external terminal, or a server in a mobile communication network. The radio signal may include various types of data according to transmission and reception of a voice signal, a video call signal, or a text/multimedia message.

The lower cover 12 may be disposed below the main circuit board 14 and the battery 19. The lower cover 12 may be fixed by being fastened to the bracket 13. The lower cover 12 may form the upper side surface, the lower side surface, and the bottom surface of the electronic device 10. The lower cover 12 may include plastic, metal, or both plastic and metal.

The lower cover 12 may include a second camera hole CMH2 through which the bottom surface of the camera device 16 is exposed.

The locations of the light transmission hole SH, the first camera hole CMH1, and the second camera hole CMH2 are not limited to those shown in FIG. 2.

Figure 3:
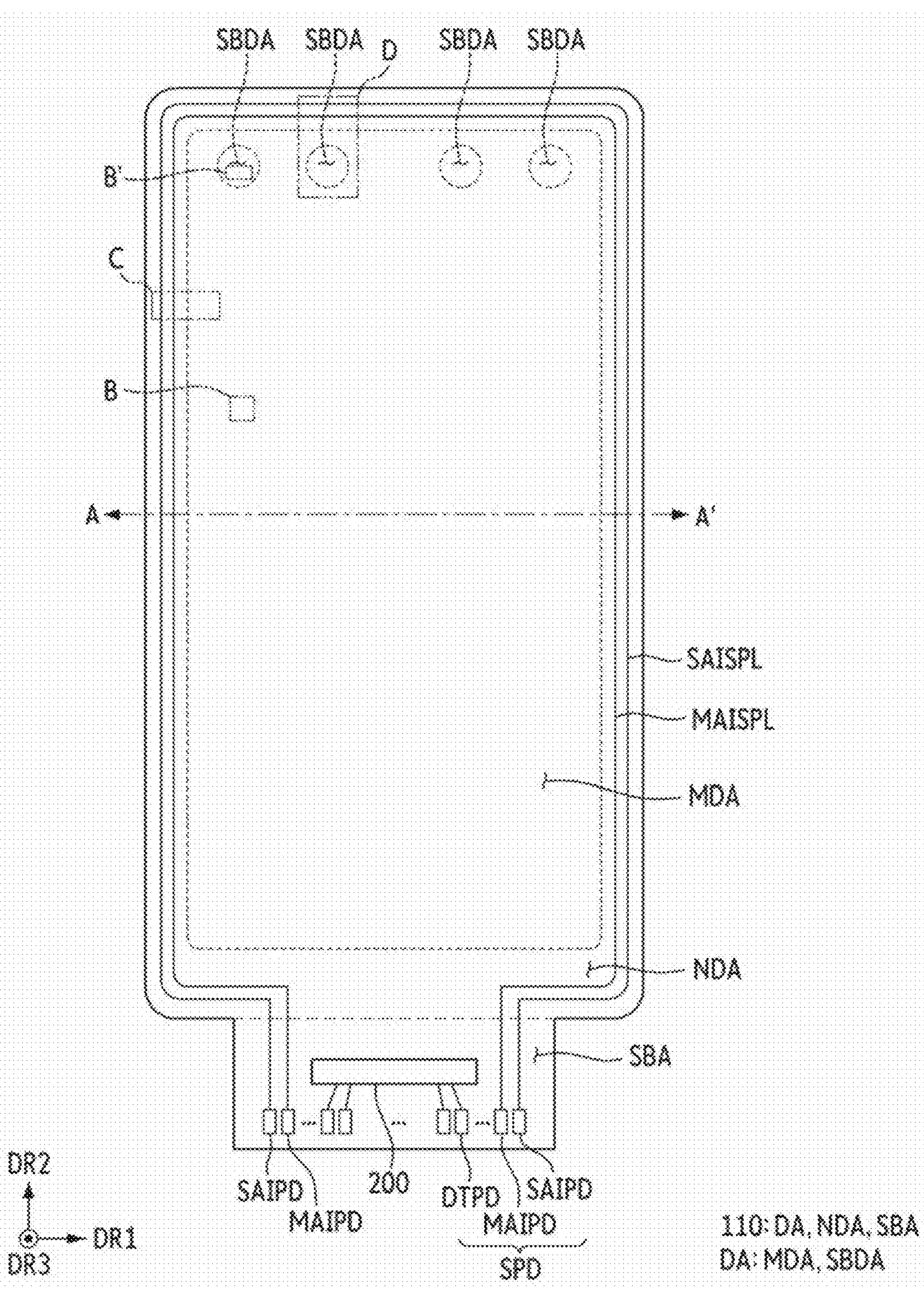
FIG. 3 is a plan view illustrating the display device of FIG. 2 according to one embodiment.

FIG. 3 is a plan view illustrating the display device of FIG. 2.

The display device 100 may include a substrate 110.

The substrate 110 may include the display area DA disposed in most of the center of the display surface of the display device 100, the non-display area NDA disposed at the edge of the display surface of the display device 100, and the sub-region SBA protruding from one side of the non-display area NDA.

The display area DA may include the main display area MDA disposed in most of the display area DA, and the at least one sub-display area SBDA surrounded by the main display area MDA.

The at least one sub-display area SBDA may overlap the at least one optical device 18 (see FIG. 2).

The non-display area NDA may be disposed around the display area DA. In other words, the main display area MDA may be surrounded by the non-display area NDA.

According to embodiments, the display device 100 may include a main anode initialization voltage supply line MAISPL and a sub-anode initialization voltage supply line SAISPL disposed in the non-display area NDA.

The main anode initialization voltage supply line MAISPL may extend to the sub-region SBA and may be electrically connected to a main anode initialization supply pad MAIPD. In other words, the main anode initialization voltage supply line MAISPL may extend into the sub-region SBA to be electrically connected to the main anode initialization supply pad MAIPD.

The main anode initialization voltage supply line MAISPL may transmit a main anode initialization voltage for initializing main light emitting elements MLE (see FIG. 6) disposed in emission areas MEA (see FIG. 5) of the main display area MDA.

The sub-anode initialization voltage supply line SAISPL may extend to the sub-region SBA and may be electrically connected to a sub-anode initialization voltage supply pad SAIPD. In other words, the sub-anode initialization voltage supply line SAISPL may extend into the sub-region SBA to be electrically connected to the sub-anode initialization voltage supply pad SAIPD.

The sub-anode initialization voltage supply line SAISPL may transmit a sub-anode initialization voltage for initializing sub-light emitting elements SLE (see FIG. 8) disposed in emission areas SEA (see FIG. 7) of the sub-display area SBDA.

According to embodiments, the sub-anode initialization voltage supply line SAISPL is arranged separately from the main anode initialization voltage supply line MAISPL. This configuration allows a sub-anode initialization voltage, with a voltage level different from that of the main anode initialization voltage, to be supplied to the sub-light-emitting elements SLE.

Accordingly, even if the sub-light emitting elements SLE are sized differently from the main light-emitting elements MLE, the difference in voltage levels between the sub-anode initialization voltage and the main anode initialization voltage can compensate for these size variations. As a result, the sub-light-emitting elements SLE can be initialized to a voltage level similar to that of the main light-emitting elements MLE.

Accordingly, the visible distinction between the at least one sub-display area SBDA and the main display area MDA may be reduced, thereby improving the display quality of the display device 100.

In other words, the display device 100 may include a top surface portion facing the top surface portion of the cover window 11, a left side portion facing the left side portion of the cover window 11, and a right side portion facing the right side portion of the cover window 11. The left surface portion of the display device 100 may extend from the left side of the top surface portion, and the right surface portion of the display device 100 may extend from the right side of the top surface portion.

Each of the top, left, and right surface portions of the display device 100 may include the display area DA and the non-display area NDA.

The display area DA may be disposed on most of each of the top, left, and right surface portions of the display device 100.

The non-display area NDA may be disposed at the upper edge and lower edge of the top surface portion of the display device 100, the upper edge, left edge, and lower edge of the left surface portion of the display device 100, and the upper edge, right edge, and lower edge of the right surface portion of the display device 100.

The sub-region SBA may protrude in the second direction DR2 from at least a part of one side of the display surface.

Since a portion of the sub-region SBA is transformed in a bent shape, another portion of the sub-region SBA may overlap the display area DA and the non-display area NDA in the third direction DR3.

The display driving circuit 200 may be mounted in the sub-region SBA of the substrate 110.

The display driving circuit 200 may output a data signal Vdata (see FIG. 9) based on control signals and power voltages supplied from the display circuit board 300.

The display driving circuit 200 may be provided as an integrated circuit (IC) and mounted on the sub-region SBA of the display device 100 by a chip on glass (COG) method, a chip on plastic (COP) method, or an ultrasonic method. However, this is only an example, and one embodiment is not limited thereto. For example, the display driving circuit 200 may be mounted on the display circuit board 300.

The display circuit board 300 (see FIG. 2) may be electrically connected to pads SPD arranged at the edge of the sub-region SBA of the substrate 110.

The pads SPD may include data pads DTPD electrically connected to the display driving circuit 200, the main anode initialization voltage supply pad MAIPD electrically connected to the main anode initialization voltage supply line MAISPL, and the sub-anode initialization voltage supply pad SAIPD electrically connected to the sub-anode initialization voltage supply line SAISPL.

One end of the display circuit board 300 may be attached onto the pads SPD disposed at the lower edge of the sub-region SBA of the display device 100 by using an anisotropic conductive film.

The display circuit board 300 may be a flexible printed circuit board (FPCB) which is bendable, a rigid printed circuit board (PCB) which maintains a flat shape, or a composite printed circuit board having both of the rigid printed circuit board and the flexible printed circuit board.

According to one embodiment, the touch driving circuit 400 (see FIG. 2) may be further mounted on the sub-region SBA of the display device 100.

Alternatively, as shown in FIG. 2, the touch driving circuit 400 may be mounted on the display circuit board 300.

The touch driving circuit 400 may be electrically connected to a touch sensor layer 150 (see FIG. 4) of the display device 100.

The touch driving circuit 400 may determine whether the user has touched and whether the user has approached by applying touch driving signals to driving lines of the touch sensor layer 150 and detecting charge changes of capacitances based on touch sensing signals received from sensing lines. The user's touch may mean that an object such as the user's finger or a pen comes into direct contact with the top surface of the cover window 11 disposed on the touch sensor layer. The user's approach may mean that the object such as the pen or the user's finger hovers over the top surface of the cover window 11. The touch driving circuit 400 may output touch data including the user's touch coordinates to the main processor 15.

Figure 4:
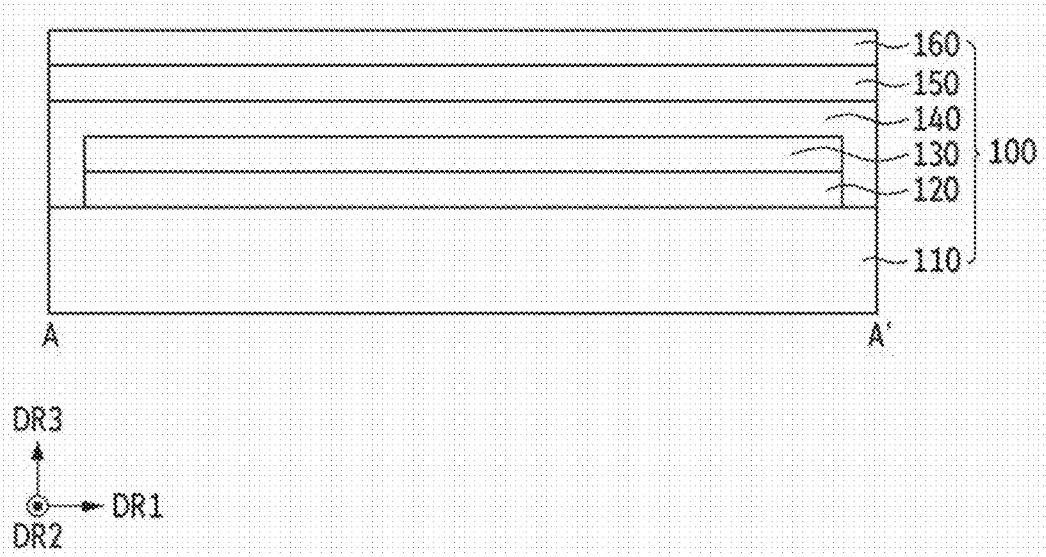
FIG. 4 is a cross-sectional view taken along line A-A' of FIG. 3.

FIG. 4 is a cross-sectional view taken along line A-A' of FIG. 3.

Referring to FIG. 4, the display device 100 according to embodiments may include the substrate 110, a circuit layer 120 disposed on the substrate 110, and an element layer 130 disposed on the circuit layer 120.

In addition, the display device 100 according to embodiments may further include an encapsulation layer 140 covering the element layer 130, the touch sensor layer 150 disposed on the encapsulation layer 140, and a polarization layer 160 disposed on the touch sensor layer 150.

The substrate 110 may be formed of an insulating material such as a polymer resin. For example, the substrate 110 may be formed of polyimide. The substrate 110 may be a flexible substrate which can be bent, folded or rolled.

Alternatively, the substrate 110 may be formed of an insulating material such as glass or the like.

The substrate 110 may include the display area DA, the non-display area NDA, and the sub-region SBA.

The display area DA may include the main display area MDA (see FIG. 3) and the at least one sub-display area SBDA (see FIG. 3).

The element layer 130 may include the main light emitting elements MLE (see FIG. 6) disposed in the emission areas MEA (see FIG. 5) of the main display area MDA, and the sub-light emitting elements SLE (see FIG. 8) disposed in the emission areas SEA (see FIG. 7) of the at least one sub-display area SBDA.

The circuit layer 120 may include main light emitting pixel drivers MEPD (see FIG. 5) electrically connected to the main light emitting elements MLE, and sub-light emitting pixel drivers SEPD (see FIG. 7) electrically connected to the sub-light emitting elements SLE.

The encapsulation layer 140 may cover the element layer 130 and may extend to the non-display area NDA to be in contact with the circuit layer 120. The encapsulation layer 140 may include a structure in which two or more inorganic layers and at least one organic layer are alternately stacked.

The touch sensor layer 150 may be disposed on the encapsulation layer 140.

The touch sensor layer 150 may include touch electrodes for detecting the touch of a person or object applied to the display surface of the display device 100.

The polarization layer 160 blocks external light reflected from the touch sensor layer 150, the encapsulation layer 140, the element layer 130, and the circuit layer 120, and the interfaces thereof, and this is to prevent the deterioration of visibility of an image due to external light reflection.

The cover window 11 (see FIG. 2) of the electronic device 10 (see FIG. 2) may be disposed on the polarization layer 160.

The cover window 11 may be attached to the polarization layer 160 by a transparent adhesive member such as an optically clear adhesive (OCA) film or an optically clear resin (OCR).

The cover window 11 may be made of an inorganic material such as glass, or an organic material such as plastic or a polymer material.

Due to the cover window 11, the touch sensor layer 150, the encapsulation layer 140, the element layer 130, and the circuit layer 120 may be protected from electrical and physical impact on the display surface.

Figure 5:
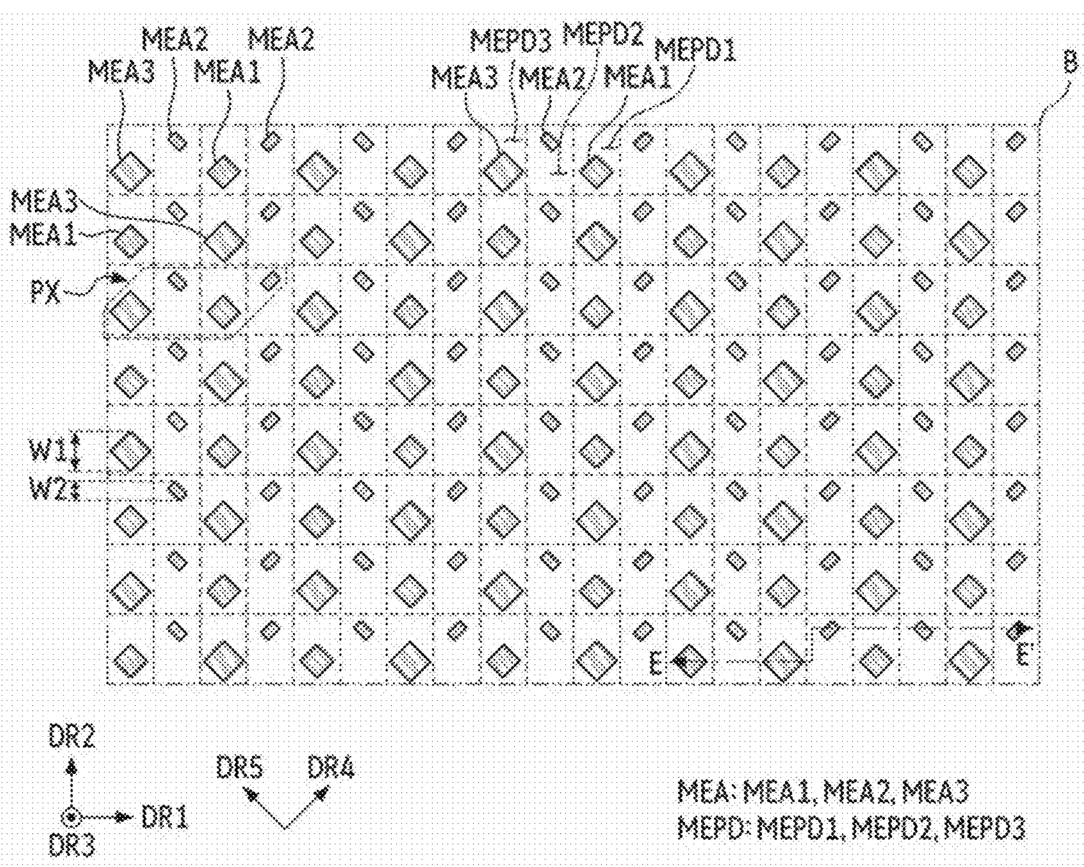
FIG. 5 is a layout diagram illustrating part B of FIG. 3.

FIG. 5 is a layout diagram illustrating part B of FIG. 3. FIG. 6 is a cross-sectional view taken along line E-E' of FIG. 5.

According to embodiments, the display area DA of the display device 100 may include the main display area MDA and the at least one sub-display area SBDA.

Referring to FIG. 5, the emission areas MEA may be arranged in the main display area MDA.

The main display area MDA may include a non-emission area NEA located between the emission areas MEA.

The emission areas MEA of the main display area MDA may have a rhombus planar shape or a rectangular planar shape. However, this is only an example, and the planar shape of the emission areas MEA of the main display area MDA according to embodiments is not limited to that illustrated in FIG. 5. In other words, in a plan view, the emission areas MEA of the main display area MDA may have a polygonal shape such as a quadrangle, a pentagon, and a hexagon, or may have a circular or elliptical shape including the edge of a curve.

The emission areas MEA of the main display area MDA may include first emission areas MEA1 that emit light in a first wavelength band, second emission areas MEA2 that emit light in a second wavelength band lower than the first wavelength band, and third emission areas MEA3 that emit light in a third wavelength band lower than the second wavelength band.

For example, the first wavelength band may be from about 600 nm to about 750 nm and may correspond to a red color. The second wavelength band may be from about 480 nm to about 560 nm and may correspond to a green color. The third wavelength band may be from about 370 nm to about 460 nm and may correspond to a blue color.

In the main display area MDA, the first emission areas MEA1 and the third emission areas MEA3 may be alternately disposed in the first direction DR1 or the second direction DR2.

In the main display area MDA, the second emission areas MEA2 may be arranged side by side in the first direction DR1 or the second direction DR2.

In addition, the second emission areas MEA2 may be adjacent to the first emission areas MEA1 and the third emission areas MEA3 in diagonal directions DR4 and DR5 crossing the first direction DR1 and the second direction DR2.

Pixels PX, which display their respective luminances and colors, may be formed by the first emission area MEA1, the second emission area MEA2, and the third emission area MEA3 adjacent to each other among these emission areas MEA.

In other words, each pixel PX serves as a basic unit for displaying various colors including white with a predetermined luminance.

Each of the pixels PX may include at least one first emission area MEA1, at least one second emission area MEA2, and at least one third emission area MEA3 that are adjacent to each other. Accordingly, each of the pixels PX may display various colors through a mixture of the light emitted from the first emission area MEA1, the second emission area MEA2, and the third emission area MEA3 that are adjacent to each other.

For example, among the emission areas MEA of the main display area MDA, the third emission area MEA3 may have a first width W1 in the second direction DR2, and the second emission area MEA2 may have a second width W2 less than the first width W1 in the second direction DR2. The first emission area MEA1 may have a width less than the first width W1 and greater than the second width W2.

The circuit layer 120 (see FIG. 4) may include the main light emitting pixel drivers MEPD electrically connected to the emission areas MEA of the main display area MDA.

The main light emitting pixel drivers MEPD may include a first main light emitting pixel driver MEPD1 electrically connected to the light emitting element MLE (see FIG. 6) of the first emission area MEA1, a second main light emitting pixel driver MEPD2 electrically connected to the light emitting element MLE (see FIG. 6) of the second emission area MEA2, and a third main light emitting pixel driver MEPD3 electrically connected to the light emitting element MLE (see FIG. 6) of the third emission area MEA3.

The main light emitting pixel drivers MEPD may be arranged side by side in the main display area MDA.

The first main light emitting pixel driver MEPD1 and the third main light emitting pixel driver MEPD3 may be alternately arranged in the second direction DR2.

The second main light emitting pixel drivers MEPD2 may be arranged side by side in the second direction DR2.

The second main light emitting pixel driver MEPD2 may be disposed between the first main light emitting pixel driver MEPD1 and the third main light emitting pixel driver MEPD3 in the first direction DR1.

Referring to FIG. 6, the element layer 130 may include the main light emitting elements MLE disposed in the emission areas MEA of the main display area MDA.

The main light emitting element MLE may be an organic light emitting diode having a light emitting layer made of an organic light emitting material. Alternatively, the main light emitting element MLE may be an inorganic light emitting element having a light emitting layer made of an inorganic semiconductor. Alternatively, the main light emitting element MLE may be a quantum dot light emitting element having a quantum dot light emitting layer. Alternatively, the main light emitting element MLE may be a micro light emitting diode.

In other words, each of the main light emitting elements MLE may include the anode electrode 131 and the cathode electrode 134 facing each other, and the light emitting layer 133 disposed therebetween.

In other words, the element layer 130 may include the anode electrodes 131 disposed in the emission areas MEA of the main display area MDA, a pixel defining layer 132 disposed in the non-emission area NEA and covering the edges of the anode electrodes 131, light emitting layers 133 disposed on the anode electrodes 131, and the cathode electrode 134 disposed on the light emitting layers 133 and the pixel defining layer 132.

Each of the main light emitting elements MLE may further include a first common layer 135 disposed between the anode electrode 131 and the light emitting layer 133, and a second common layer 136 disposed between the light emitting layer 133 and the cathode electrode 134.

The anode electrodes 131 may be electrically connected to the main light emitting pixel drivers MEPD of the circuit layer 120. This anode electrode 131 may be referred to as a pixel electrode.

The pixel defining layer 132 may include an organic insulating material.

The light emitting layer 133 may be disposed on the anode electrode 131. The light emitting layer 133 may be formed of an organic light emitting material that converts electron-hole pairs into light.

The cathode electrode 134 may be disposed on the pixel defining layer 132 and the light emitting layers 133. In other words, the cathode electrode 134 may be disposed entirely in the main display area MDA. The cathode electrode 134 may be referred to as a common electrode.

The encapsulation layer 140 may be disposed on the circuit layer 120 and cover the element layer 130.

The encapsulation layer 140 may include a first encapsulation layer 141 disposed on the element layer 130 and containing an inorganic insulating material, a second encapsulation layer 142 covering the element layer 130 and containing an organic insulating material, and a third encapsulation layer 143 covering the second encapsulation layer 142 and containing an inorganic insulating material.

Figure 7:
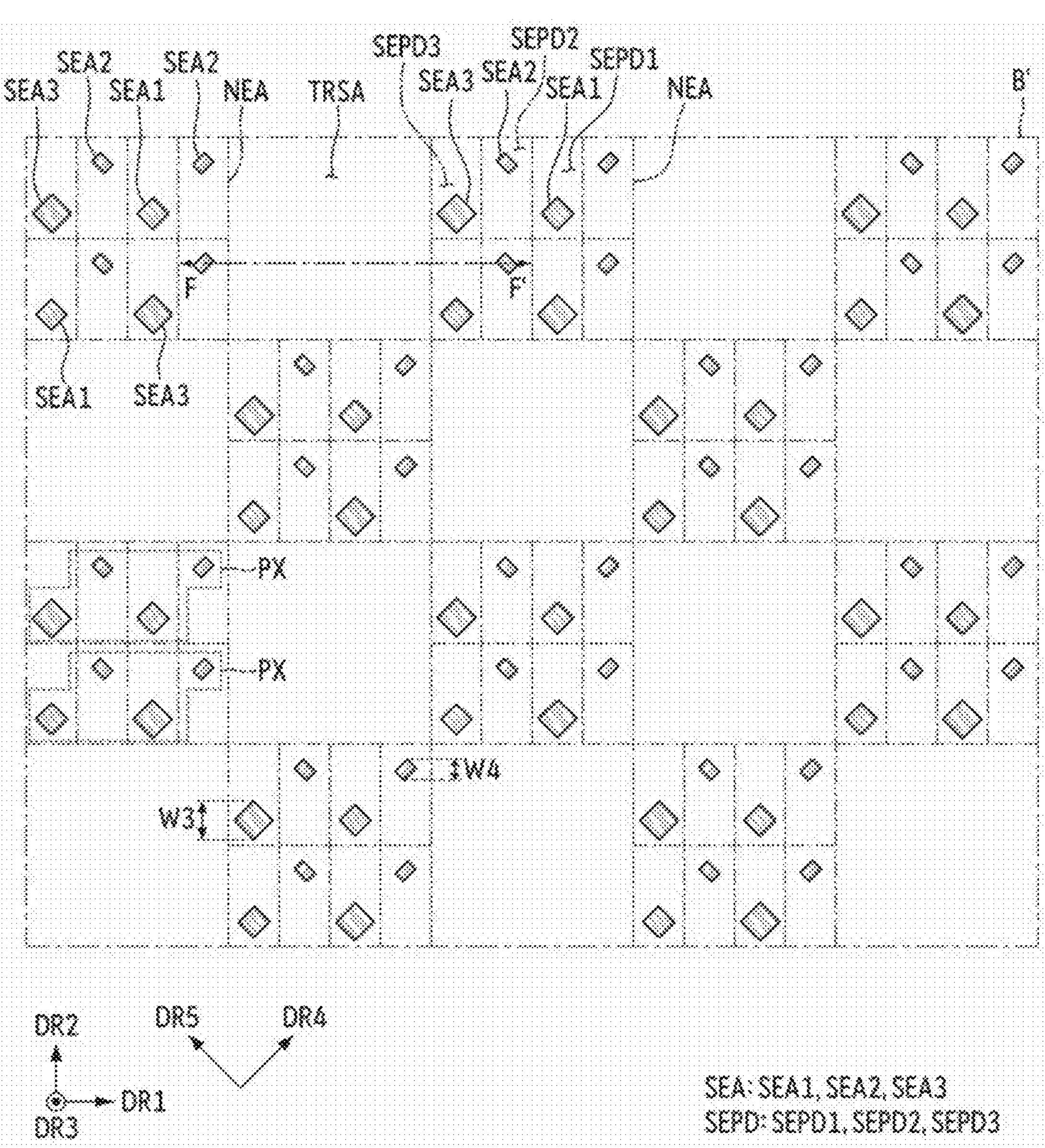
FIG. 7 is a layout diagram illustrating part B' of FIG. 3.
Figure 8:
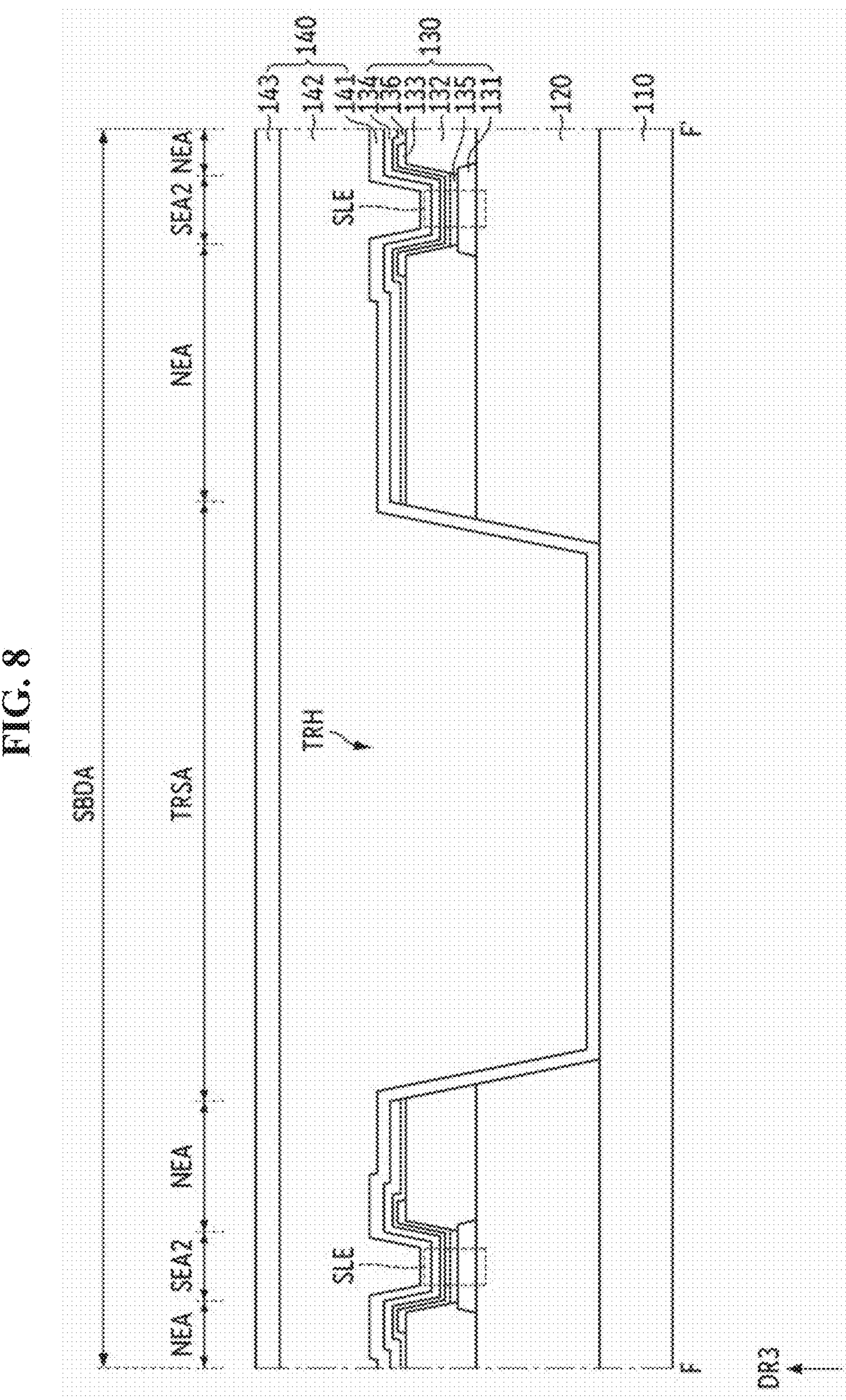
FIG. 8 is a cross-sectional view taken along line F-F' of FIG. 7.

FIG. 7 is a layout diagram illustrating part B' of FIG. 3. FIG. 8 is a cross-sectional view taken along line F-F' of FIG. 7.

According to embodiments, the display area DA of the display device 100 may include the main display area MDA and the at least one sub-display area SBDA.

The at least one sub-display area SBDA may overlap the at least one optical device 18 (see FIG. 2).

Referring to FIG. 7, the at least one sub-display area SBDA according to the embodiments may include emission areas SEA, and light transmission areas TRSA disposed between the emission areas SEA.

In other words, the emission areas SEA may be arranged in certain regions of the at least one sub-display area SBDA, while the light transmission areas TRSA may be positioned in other regions between these certain regions.

The at least one sub-display area SBDA may further include the non-emission area NEA disposed between the emission areas SEA.

The emission areas SEA of the at least one sub-display area SBDA may have a rhombus or rectangular planar shape. However, this is only an example, and the planar shape of the emission areas SEA of the sub-display area SBDA according to embodiments is not limited to that illustrated in FIG. 7. In other words, in a plan view, the emission areas SEA of the sub-display area SBDA may have a polygonal shape such as a quadrangle, a pentagon, and a hexagon, or may have a circular or elliptical shape including the edge of a curve.

The emission areas SEA of at least one sub-display area SBDA may include first emission areas SEA1 that emit light in a first wavelength band, second emission areas SEA2 that emit light in a second wavelength band lower than the first wavelength band, and third emission areas SEA3 that emit light in a third wavelength band lower than the second wavelength band.

In the at least one sub-display area SBDA, the first emission areas SEA1 and the third emission areas SEA3 may be alternately disposed in the first direction DR1 or the second direction DR2.

In the at least one sub-display area SBDA, the second emission areas SEA2 may be arranged side by side in the first direction DR1 or the second direction DR2.

In addition, the second emission areas SEA2 may be adjacent to the first emission areas SEA1 and the third emission areas SEA3 in diagonal directions DR4 and DR5 crossing the first direction DR1 and the second direction DR2.

Pixels PX, which display their respective luminances and colors, may be formed by the first emission area SEA1, the second emission area SEA2, and the third emission area SEA3 adjacent to each other among these emission areas SEA.

For example, the third emission area SEA3 among the emission areas SEA of the at least one sub-display area SBDA may have a third width W3 in the second direction DR2, and the second emission area SEA2 may have a fourth width W4 less than the third width W3 in the second direction DR2. The first emission area SEA1 may have a width less than the third width W3 and greater than the fourth width W4.

Further, to reduce the visibility of the light transmission areas TRSA, the emission areas SEA within the at least one sub-display area SBDA may be designed with widths larger than those of the emission areas MEA (see FIG. 5) in the main display area MDA.

In other words, the third width W3 may be greater than the first width W1 (see FIG. 5), and the fourth width W4 may be greater than the second width W2 (see FIG. 5).

The circuit layer 120 (see FIG. 4) may include the sub-light emitting pixel drivers SEPD electrically connected to the emission areas SEA of the at least one sub-display area SBDA.

The sub-light emitting pixel driver SEPD may include a first sub-light emitting pixel driver SEPD1 electrically connected to the light emitting element SLE (see FIG. 8) of the first emission area SEA1, a second sub-light emitting pixel driver SEPD2 electrically connected to the light emitting element SLE (see FIG. 8) of the second emission area SEA2, and a third sub-light emitting pixel driver SEPD3 electrically connected to the light emitting element SLE (see FIG. 8) of the third emission area SEA3.

The sub-light emitting pixel drivers SEPD may be arranged side by side in each partial area of the at least one sub-display area SBDA.

The first sub-light emitting pixel driver SEPD1 and the third sub-light emitting pixel driver SEPD3 may be alternately arranged in the second direction DR2.

The second sub-light emitting pixel drivers SEPD2 may be arranged side by side in the second direction DR2.

The second sub-light emitting pixel driver SEPD2 may be disposed between the first sub-light emitting pixel driver SEPD1 and the third sub-light emitting pixel driver SEPD3 in the first direction DR1.

The light transmission area TRSA may be adjacent to two or more emission areas SEA and may transmit light.

At least one optical device 18 disposed under the substrate 110 may overlap the at least one sub-display area SBDA, and may operate based on light transmitted through the light transmission areas TRSA of the at least one sub-display area SBDA. In other words, at least one optical device 18 positioned beneath the substrate 110 may overlap with the at least one sub-display area SBDA and operate based on light passing through the light transmission areas TRSA within the sub-display area SBDA.

Accordingly, even if the display device 100 according to embodiments does not have a hole for accommodating the optical device 18, the optical device 18 can still function effectively.

Consequently, the potential reduction in the display area DA ratio of the display device 100 due to the placement of the optical device 18 can be avoided, thereby enhancing the display quality and the aesthetics of the display device 100.

Each of the light transmission areas TRSA may be adjacent to at least one pixel PX both in the first direction DR1 and the second direction DR2.

The width of the light transmission area TRSA in the first direction DR1 may be in a range similar to a multiple of the width of the pixel PX in the first direction DR1, and the width of the light transmission area TRSA in the second direction DR2 may be in a range similar to a multiple of the width of the pixel PX in the first direction DR1.

In this case, the light transmission areas TRSA may be alternately arranged with two or more pixels PX in the second direction DR2. In addition, the light transmission areas TRSA may be alternately disposed with at least one pixel PX in the first direction DR1.

To enhance the light transmission of the light transmission area TRSA, the light emitting elements SLE (see FIG. 8) and their associated light emitting pixel drivers SEPD do not overlap the light transmission area TRSA.

Referring to FIG. 8, the display device 100 according to the embodiments may include a light transmission hole TRH overlapping the light transmission area TRSA.

To reduce light loss, the light transmission hole TRH may penetrate the element layer 130 and the circuit layer 120.

In this case, the first encapsulation layer 141 of the encapsulation layer 140 may be in contact with the substrate 110 through the light transmission hole TRH.

According to the embodiments, the element layer 130 may include the sub-light emitting elements SLE disposed in the emission areas SEA of the at least one sub-display area SBDA.

The sub-light emitting elements SLE are substantially the same as the main light emitting elements MLE (see FIG. 6) except that they are disposed in the emission areas SEA of the at least one sub-display area SBDA, and thus redundant descriptions will be omitted below.

Figure 9:
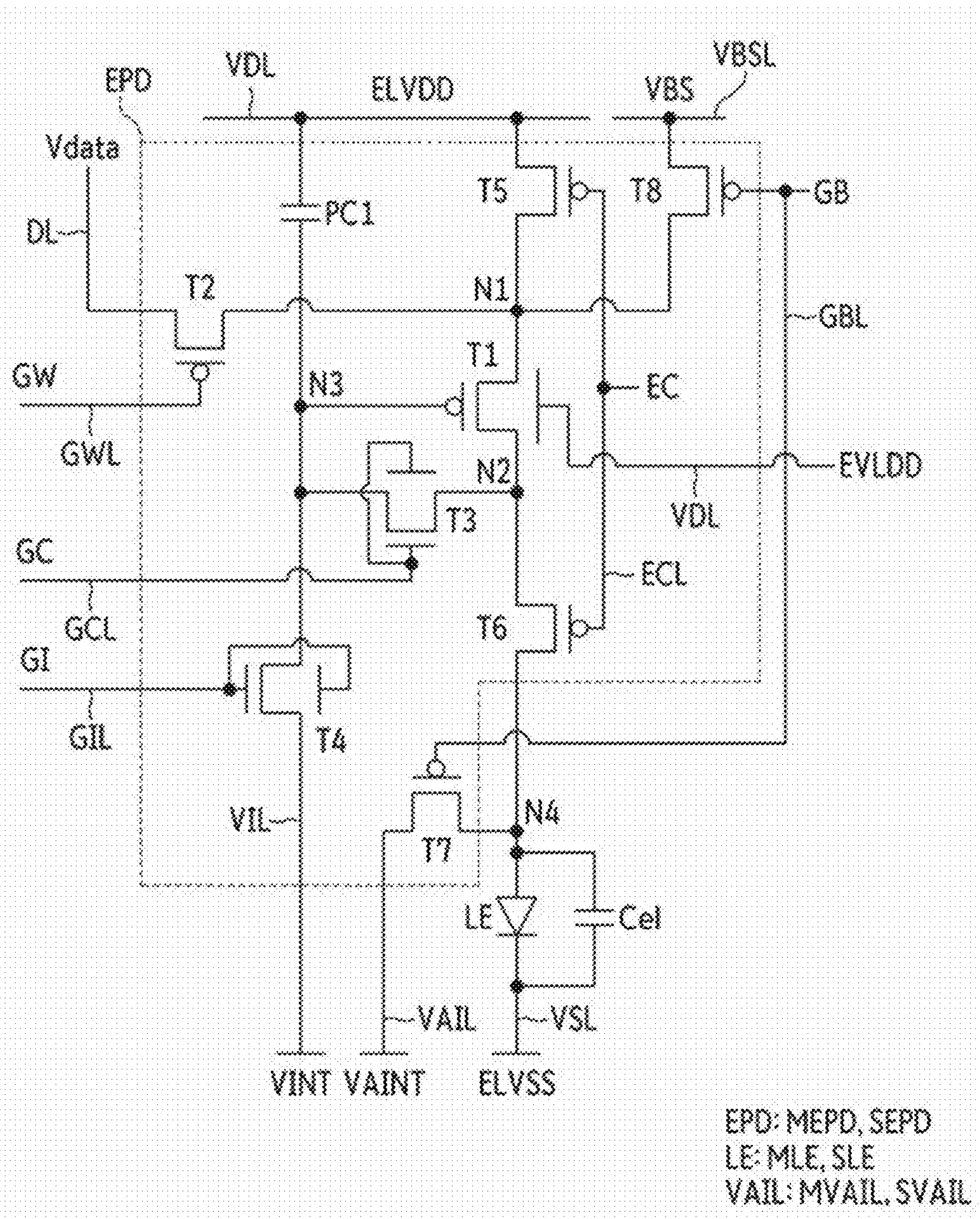
FIG. 9 is an equivalent circuit diagram showing one of the main light emitting pixel drivers of FIG. 5 and the sub-light emitting pixel drivers of FIG. 7.

FIG. 9 is an equivalent circuit diagram showing one of the main light emitting pixel drivers of FIG. 5 and the sub-light emitting pixel drivers of FIG. 7.

According to the embodiments, the circuit layer 120 (see FIG. 4) may include the main light emitting pixel drivers MEPD (see FIG. 5) electrically connected to the main light emitting elements MLE (see FIG. 6), and the sub-light emitting pixel drivers SEPD (see FIG. 7) electrically connected to the sub-light emitting elements SLE (see FIG. 8).

Figure 11:
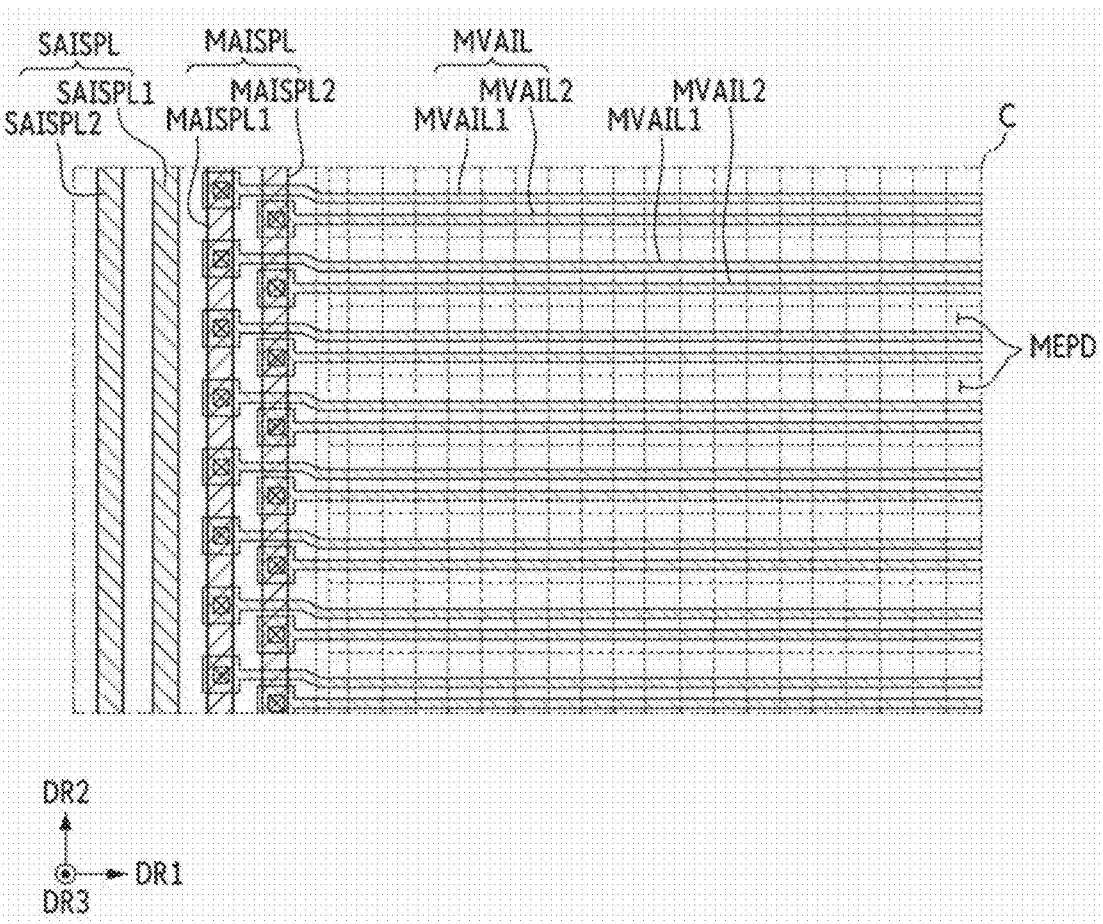
FIG. 11 is a layout diagram illustrating part C of FIG. 3.
Figure 12:
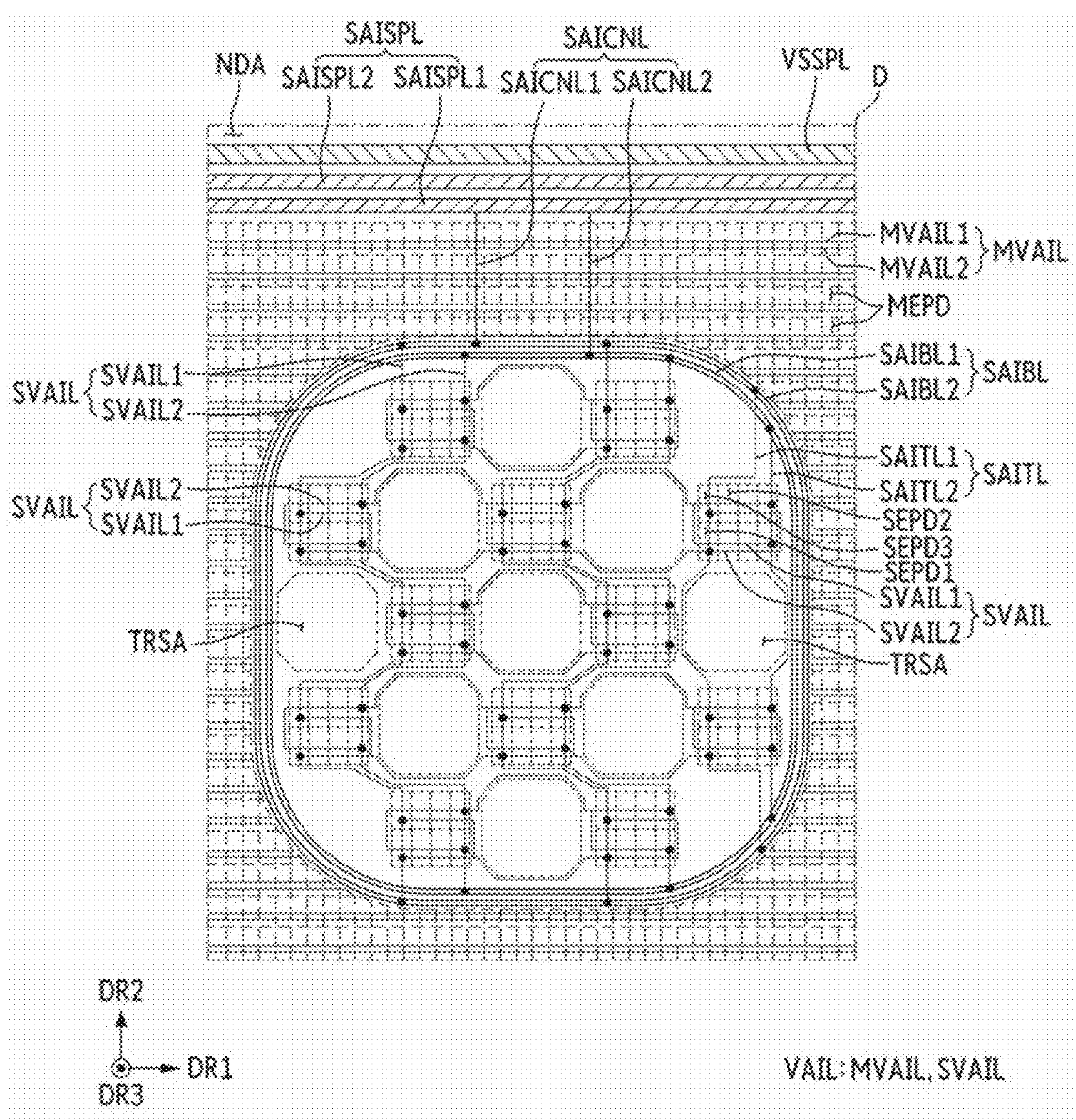
FIG. 12 is a layout diagram illustrating part D of FIG. 3.

The main light emitting pixel driver MEPD and the sub-light emitting pixel driver SEPD are similar to each other, except that the main light emitting pixel driver MEPD is electrically connected to the main light emitting element MLE and a main anode initialization voltage line MVAIL (scc FIGS. 11 and 12), while the sub-light emitting pixel driver SEPD is electrically connected to the sub-light emitting element SLE and a sub-anode initialization voltage line SVAIL (see FIG. 12).

Accordingly, hereinafter, the main light emitting pixel driver MEPD (see FIG. 5) and the sub-light emitting pixel driver SEPD (see FIG. 7) may be collectively referred to as the light emitting pixel driver EPD, the main light emitting element MLE and the sub-light emitting element SLE may be collectively referred to as the light emitting element LE, and the main anode initialization voltage line MVAIL (see FIGS. 11 and 12) and the sub-anode initialization voltage line SVAIL (see FIG. 12) may be collectively referred to as an anode initialization voltage line VAIL, for simplicity of description.

Referring to FIG. 9, one of the light emitting pixel drivers EPD may be electrically connected between a first power source ELVDD and one of the light emitting elements LE. One light emitting element LE may be electrically connected between one light emitting pixel driver EPD and a second power source ELVSS.

The second power source ELVSS may be at a voltage level lower than that of the first power source ELVDD.

In other words, the anode electrode of the light emitting element LE is electrically connected to the light emitting pixel driver EPD, and the cathode electrode of the light emitting element LE may be supplied with the second power source ELVSS having a voltage level lower than that of the first power source ELVDD.

A capacitor Cel connected in parallel with the light emitting element LE represents a parasitic capacitance between the anode electrode and the cathode electrode of the light emitting element LE.

The circuit layer 120 (see FIG. 4) may include a first power line VDL for transmitting the first power source ELVDD to the light emitting pixel drivers EPD.

The circuit layer 120 may further include a gate initialization voltage line VIL for transmitting a gate initialization voltage VINT, the anode initialization voltage line VAIL for transmitting an anode initialization voltage VAINT, and a bias voltage line VBSL for transmitting a bias voltage VBS.

The circuit layer 120 may further include the scan write line GWL for transmitting the scan write signal GW, the scan initialization line GIL for transmitting the scan initialization signal G1, the emission control line ECL for transmitting the emission control signal EC, the gate control line GCL for transmitting the gate control signal GC, and the bias control line GBL for transmitting the bias control signal GB.

The light emitting pixel driver EPD may include a first transistor T1 configured to generate a driving current for driving the light emitting element LE, two or more transistors T2 to T8 electrically connected to the first transistor T1, and at least one capacitor PC1.

The first transistor T1 may be electrically connected between a first node N1 and a second node N2. The first node N1 is electrically connected to the first electrode (e.g., source electrode) of the first transistor T1. The second node N2 is electrically connected to the second electrode (e.g., drain electrode) of the first transistor T1.

The pixel capacitor PC1 may be electrically connected between the first power line VDL and a third node N3. The third node N3 is electrically connected to the gate electrode of the first transistor T1.

The second transistor T2 may be electrically connected between the data line DL and the first node N1.

In other words, the first electrode of the first transistor T1 may be electrically connected to the data line DL through the second transistor T2.

The second transistor T2 may be turned on by the scan write signal GW of the scan write line GWL.

The fifth transistor T5 may be electrically connected between the first node N1 and the first power line VDL.

The sixth transistor T6 may be electrically connected between the second node N2 and a fourth node N4. The fourth node N4 is electrically connected to the anode electrode of the light emitting element LE.

In other words, the fifth transistor T5 may be electrically connected between the first electrode of the first transistor T1 and the first power line VDL.

The sixth transistor T6 may be electrically connected between the second electrode of the first transistor T1 and the anode electrode of the light emitting element LE.

The fifth transistor T5 and the sixth transistor T6 may be turned on by the emission control signal EC of the emission control line ECL.

The gate electrode of the first transistor T1 may be electrically connected to the first power line VDL through the pixel capacitor PC1.

Since the third node N3 is electrically connected to the first power line VDL through the pixel capacitor PC1, the potential of the gate electrode of the first transistor T1 may be maintained at the voltage stored in the first power line VDL.

Accordingly, when the data signal Vdata from the data line DL is transmitted to the first node N1 through the turned-on second transistor T2, the voltage difference between the gate electrode and the first electrode of the first transistor T1 may correspond to the difference between the first power source ELVDD and the data signal Vdata.

In this case, if the voltage difference between the gate electrode and the first electrode of the first transistor T1, i.e., the gate-source voltage, becomes equal to or greater than a threshold voltage, the first transistor T1 may be turned on, thereby generating a drain-source current proportional to the data signal Vdata.

Then, when the fifth transistor T5 and the sixth transistor T6 are turned on, the first transistor T1 may be connected in series with the light emitting element LE between the first power line VDL and a second power line VSL. Accordingly, the drain-source current of the first transistor T1 corresponding to the data signal Vdata may be supplied as a driving current of the light emitting element LE.

Accordingly, the light emitting element LE may emit light having a luminance corresponding to the data signal Vdata.

The third transistor T3 may be electrically connected between the second node N2 and the third node N3. In other words, the third transistor T3 may be electrically connected between the gate electrode of the first transistor T1 and the second electrode of the first transistor T1.

The third transistor T3 may be turned on by the gate control signal GC of the gate control line GCL.

When the third transistor T3 is turned-on, the voltage difference between the second node N2 and the third node N3 may be initialized.

The fourth transistor T4 may be electrically connected between the gate initialization voltage line VIL and the third node N3. In other words, the fourth transistor T4 may be connected between the gate electrode of the first transistor T1 and the gate initialization voltage line VIL.

The fourth transistor T4 may be turned on by the scan initialization signal G1 of the scan initialization line GIL.

The potential of the third node N3 may be initialized by the turned-on fourth transistor T4.

The third transistor T3 and the fourth transistor T4 may be provided as N-type MOSFETs.

The seventh transistor T7 may be electrically connected between the fourth node N4 and the anode initialization voltage line VAIL. In other words, the seventh transistor T7 may be electrically connected between the anode electrode of the light emitting element LE and the anode initialization voltage line VAIL.

The seventh transistor T7 may be turned on by the bias control signal GB of the bias control line GBL.

The potential of the fourth node N4 may be initialized by the turned-on seventh transistor T7.

The eighth transistor T8 may be electrically connected between the first node N1 and the bias voltage line VBSL. In other words, the eighth transistor T8 may be electrically connected between the first electrode of the first transistor T1 and the bias voltage line VBSL.

The eighth transistor T8 may be turned on by the bias control signal GB of the bias control line GBL.

The potential of the first node N1 may be initialized by the turned-on eighth transistor T8.

According to one embodiment, the third transistor T3 and the fourth transistor T4 among the first to eighth transistors T1 to T8 included in the light emitting pixel driver EPD are provided as N-type MOSFETs, and the remaining transistors T1, T2, and T5 to T8 except for the third transistor T3 and the fourth transistor T4 may be provided as P-type MOSFETs.

To achieve this, the circuit layer 120 may include a first semiconductor layer (CH1, S1, D1, CH2, S2, D2, CH6, S6, and D6 of FIG. 10) for providing a P-type MOSFET and a second semiconductor layer (CH4, S4 and D4 of FIG. 10) for providing an N-type MOSFET.

The first semiconductor layer may include a channel portion, a first electrode portion, and a second electrode portion of each of the P-type MOSFETs T1, T2, T5, T6, T7, and T8 (see FIG. 5).

The second semiconductor layer may include a channel portion, a first electrode portion, and a second electrode portion of each of the N-type MOSFETs T3 and T4 (see FIG. 5).

In each of the transistors, the first electrode portion may be connected to a first side of the channel portion, and the second electrode portion may be connected to a second side of the channel portion.

The first electrode portion may be a first electrode or a source electrode.

The second electrode portion may be a second electrode or a drain electrode.

Figure 10:
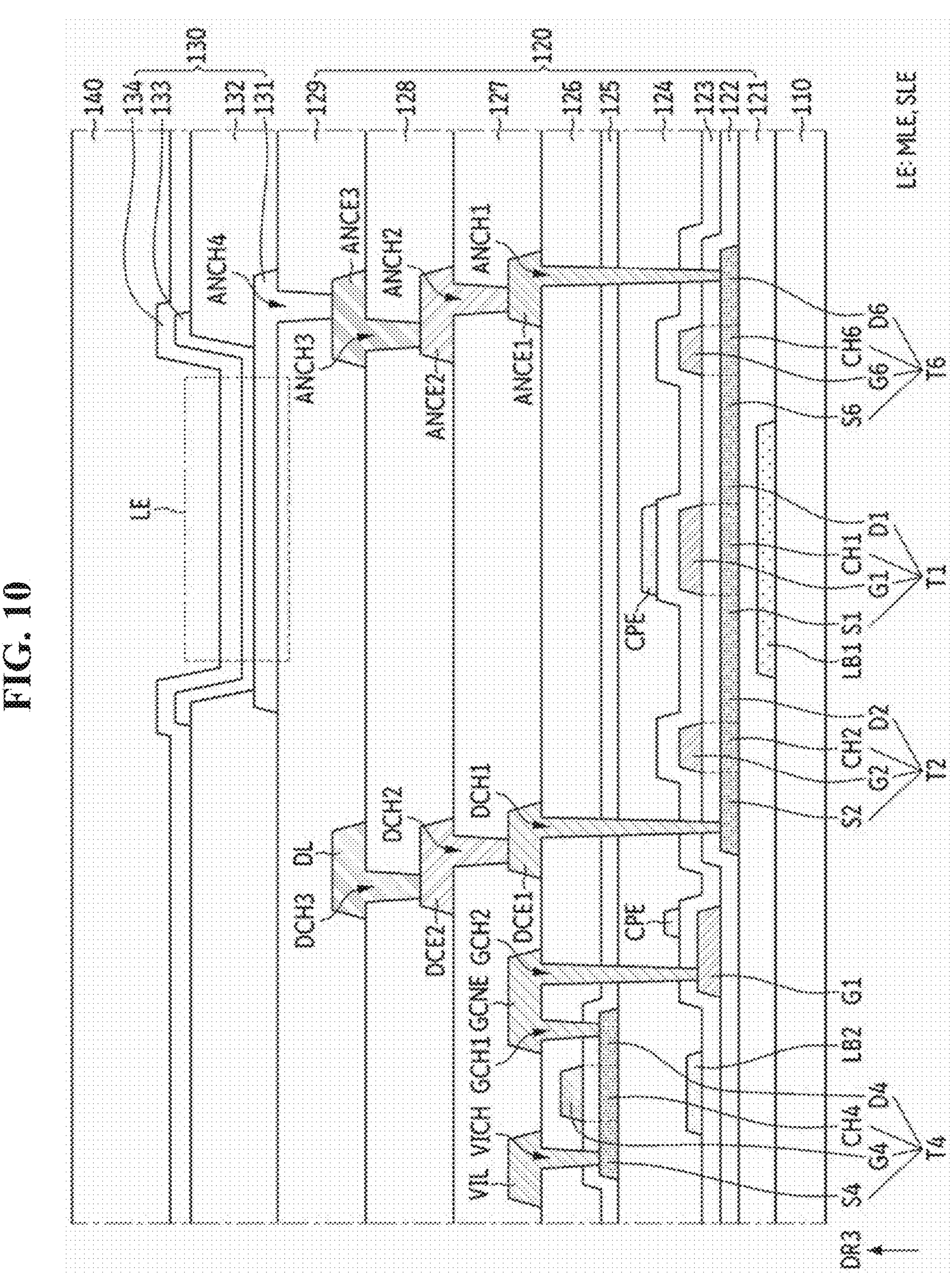
FIG. 10 is a cross-sectional view illustrating a light emitting element, and the first transistor, the second transistor, the fourth transistor, and the sixth transistor of FIG. 9.

FIG. 10 is a cross-sectional view illustrating a light emitting element, and the first transistor, the second transistor, the fourth transistor, and the sixth transistor of FIG. 9.

Referring to FIG. 10, the circuit layer 120 may include a buffer layer 121 covering a first light blocking layer LB1 on the substrate 110; a first semiconductor layer CH1, S1, D1, CH2, S2, D2, CH6, S6, and D6 disposed on the buffer layer 121; a first gate insulating layer 122 covering the first semiconductor layer CH1, S1, D1, CH2, S2, D2, CH6, S6, and D6; a first gate conductive layer G1, G2, and G6 disposed on the first gate insulating layer 122; a second gate insulating layer 123 covering the first gate conductive layer G1, G2, and G6; a second gate conductive layer CPE and LB2 disposed on the second gate insulating layer 123; a first interlayer insulating layer 124 covering the second gate conductive layer CPE and LB2; a second semiconductor layer CH4, S4, and D4 disposed on the first interlayer insulating layer 124; a third gate insulating layer 125 covering the second semiconductor layers CH4, S4, and D4; a third gate conductive layer G4 disposed on the third gate insulating layer 125; a second interlayer insulating layer 126 covering the third gate conductive layer G4; a first source-drain conductive layer ANCE1, DCE1, GCNE, and VIL disposed on the second interlayer insulating layer 126; a first planarization layer 127 covering the first source-drain conductive layer ANCE1, DCE1, GCNE, and VIL; a second source-drain conductive layer ANCE2 and DCE2 disposed on the first planarization layer 127; a second planarization layer 128 covering the second source-drain conductive layer ANCE2 and DCE2; and a third source-drain conductive layer ANCE3 and DL disposed on the second planarization layer 128.

The first transistor T1 may include the channel portion CH1, the source portion S1, and the drain portion D1 formed of the first semiconductor layer on the buffer layer 121, and the gate electrode G1 disposed on the first gate insulating layer 122 and overlapping the channel portion CH1.

The channel portion CH1 of the first transistor T1 may overlap the first light blocking layer LB1 on the substrate 110.

The second transistor T2 may include the channel portion CH2, the source portion S2, and the drain portion D2 formed of the first semiconductor layer on the buffer layer 121, and the gate electrode G2 disposed on the first gate insulating layer 122 and overlapping the channel portion CH2.

The sixth transistor T6 may include the channel portion CH6, the source portion S6, and the drain portion D6 formed of the first semiconductor layer on the buffer layer 121, and the gate electrode G6 disposed on the first gate insulating layer 122 and overlapping the channel portion CH6.

Since the fifth transistor T5 (see FIG. 9), the seventh transistor T7 (see FIG. 9), and the eighth transistor T8 (see FIG. 9) are P-type MOSFETs and substantially the same as the first transistor T1, the second transistor T2, and the sixth transistor T6, redundant descriptions therefor are omitted below.

The source portion S2 of the second transistor T2 may be electrically connected to the data line DL through a first data connection electrode DCE1 and a second data connection electrode DCE2. The first data connection electrode DCE1 may be stacked on the second data connection electrode DCE2.

The first data connection electrode DCE1 may be disposed on the second interlayer insulating layer 126, and may be electrically connected to the source portion S2 of the second transistor T2 through a first data connection hole DCH1 penetrating the second interlayer insulating layer 126, the third gate insulating layer 125, the first interlayer insulating layer 124, the second gate insulating layer 123, and the first gate insulating layer 122.

The second data connection electrode DCE2 may be disposed on the first planarization layer 127, and may be electrically connected to the first data connection electrode DCE1 through a second data connection hole DCH2 penetrating the first planarization layer 127.

The data line DL may be disposed on the second planarization layer 128, and may be electrically connected to the second data connection electrode DCE2 through a third data connection hole DCH3 penetrating the second planarization layer 128. The data line DL may overlap both the first data connection electrode DCE1 and the second data connection electrode DCE2.

The drain portion D2 of the second transistor T2 may be connected to the source portion S1 of the first transistor T1.

The drain portion D1 of the first transistor T1 may be connected to the source portion S6 of the sixth transistor T6.

The drain portion D6 of the sixth transistor T6 may be electrically connected to the anode electrode 131 through a first anode connection electrode ANCE1, a second anode connection electrode ANCE2, and a third anode connection electrode ANCE3. The first anode connection electrode ANCE1, second anode connection electrode ANCE2, and third anode connection electrode ANCE3 may be sequentially stacked.

The first anode connection electrode ANCE1 may be disposed on the second interlayer insulating layer 126, and may be electrically connected to the drain portion D6 of the sixth transistor T6 through a first anode connection hole ANCH1 penetrating the second interlayer insulating layer 126, the third gate insulating layer 125, the first interlayer insulating layer 124, the second gate insulating layer 123, and the first gate insulating layer 122.

The second anode connection electrode ANCE2 may be disposed on the first planarization layer 127, and may be electrically connected to the first anode connection electrode ANCE1 through a second anode connection hole ANCH2 penetrating the first planarization layer 127.

The third anode connection electrode ANCE3 may be disposed on the second planarization layer 128, and may be electrically connected to the second anode connection electrode ANCE2 through a third anode connection hole ANCH3 penetrating the second planarization layer 128.

The anode electrode 131 may be disposed on a third planarization layer 129, and may be electrically connected to the third anode connection electrode ANCE3 through a fourth anode connection hole ANCH4 penetrating the third planarization layer 129. The anode electrode 131 may overlap the first to third anode connection electrodes ANCE1, ANCE2 and ANCE3 as well as portions of the first, second and sixth transistors T1, T2 and T6.

The pixel capacitor PC1 (see FIG. 9) may be provided by an overlapping region between a capacitor electrode CPE disposed on the second gate insulating layer 123 and the gate electrode G1 of the first transistor T1.

The fourth transistor T4 may include a channel portion CH4, a source portion S4, and a drain portion D4 formed of the second semiconductor layer on the first interlayer insulating layer 124, and a gate electrode G4 disposed on the third gate insulating layer 125 and overlapping the channel portion CH4.

The channel portion CH4 of the fourth transistor T4 may overlap a second light blocking layer LB2 on the second gate insulating layer 123.

The source portion S4 of the fourth transistor T4 may be electrically connected to the first initialization power line VIL on the second interlayer insulating layer 126 through a hole penetrating the second interlayer insulating layer 126 and the third gate insulating layer 125.

The drain portion D4 of the fourth transistor T4 may be electrically connected to the gate electrode G1 of the first transistor T1 through a gate connection electrode GCNE on the second interlayer insulating layer 126.

The gate connection electrode GCNE may be electrically connected to the drain portion D4 of the fourth transistor T4 through a first gate connection hole GCH1 penetrating the second interlayer insulating layer 126 and the third gate insulating layer 125.

The gate connection electrode GCNE may be electrically connected to the gate electrode G1 of the first transistor T1 through a second gate connection hole GCH2 penetrating the second interlayer insulating layer 126, the third gate insulating layer 125, the first interlayer insulating layer 124, and the second gate insulating layer 123.

The third transistor T3, which is an N-type MOSFET, is substantially the same as the fourth transistor T4, and thus redundant description will be omitted below.

FIG. 11 is a layout diagram illustrating part C of FIG. 3.

Referring to FIG. 11, the circuit layer 120 of the display device 100 according to embodiments may include the main anode initialization voltage line MVAIL disposed in the main display area MDA (see FIG. 3). The main anode initialization voltage line MVAIL transmits the main anode initialization voltage used to initialize the main light emitting element MLE (see FIG. 6).

The main anode initialization voltage line MVAIL may extend in the first direction DR1.

In one example, the circuit layer 120 may further include a main anode initialization voltage additional line that extends in a direction intersecting the main anode initialization voltage line MVAIL and is electrically connected to the main anode initialization voltage line MVAIL. This configuration allows the main anode initialization voltage to be transmitted to the main display area MDA through a mesh-shaped wiring structure, thereby minimizing distortion or delay in the transmission of the main anode initialization voltage.

The circuit layer 120 may further include the main anode initialization voltage supply line MAISPL disposed in the non-display area NDA to transmit the main anode initialization voltage.

The main anode voltage line MVAIL may extend to the non-display area NDA and may be electrically connected to the main anode initialization voltage supply line MAISPL.

As shown in FIG. 5, in the main display area MDA (see FIG. 3), the second emission area MEA2 may have a width less than the widths of the first emission area MEA1 and the third emission area MEA3. As a result, the main light emitting element MLE of the second emission area MEA2 may be initialized differently from the main light emitting element MLE of the first emission area MEA1 or the main light emitting element MLE of the third emission area MEA3.

To address this issue, as shown in FIG. 11, the main anode initialization voltage line MVAIL may include a first main anode initialization voltage line MVAIL1 and a second main anode initialization voltage line MVAIL2. The first main anode initialization voltage line MVAIL1 and the second main anode initialization voltage line MVAIL2 may be arranged adjacent to each other and extend in the first direction DR1.

Further, the main anode initialization voltage supply line MAISPL may include a first main anode initialization voltage supply line MAISPL1 and a second main anode initialization voltage supply line MAISPL2. The first main anode initialization voltage supply line MAISPL1 and the second main anode initialization voltage supply line MAISPL2 may be arranged adjacent to each other and extend in the second direction DR2.

The first main anode initialization voltage line MVAIL1 may be electrically connected to the first main anode initialization voltage supply line MAISPL1 and may transmit the first main anode initialization voltage. The first main anode initialization voltage line MVAIL1 may overlap the second main anode initialization voltage supply line MAISPL2. The main anode initialization voltage is used to initialize the main light emitting element MLE of the first emission area MEA1 and the main light emitting element MLE of the third emission area MEA3.

In other words, the first main anode initialization voltage line MVAIL1 may be electrically connected to the first main light emitting pixel driver MEPD1 and the third main light emitting pixel driver MEPD3.

The second main anode initialization voltage line MVAIL2 may be electrically connected to the second main anode initialization voltage supply line MAISPL2, and may transmit the second main anode initialization voltage. This voltage is used to initialize the main light emitting element MLE of the second emission area MEA2.

In other words, the second main anode initialization voltage line MVAIL2 may be electrically connected to the second main light emitting pixel driver MEPD2.

The second main anode initialization voltage may have a different voltage level compared to the first main anode initialization voltage. For example, the second main anode initialization voltage may be set at a higher voltage level than the first main anode initialization voltage.

FIG. 11 illustrates that the main anode initialization voltage supply line MAISPL is disposed between the main anode voltage line MVAIL and the sub-anode initialization voltage supply line SAISPL.

FIG. 12 is a layout diagram illustrating part D of FIG. 3.

Referring to FIG. 12, the circuit layer 120 of the display device 100 according to embodiments may include both the main anode initialization voltage line MVAIL of the main display area MDA (see FIG. 3) for transmitting the main anode initialization voltage and the sub-anode initialization voltage line SVAIL disposed in the at least one sub-display area SBDA (see FIG. 3) for transmitting the sub-anode initialization voltage to initialize the sub-light emitting element SLE (see FIG. 8).

The sub-anode initialization voltage may be set at a different voltage level compared to the main anode initialization voltage.

For example, as shown in FIGS. 5 and 7, given that the sub-light emitting elements SLE are designed to have larger sizes compared to the main light emitting elements MLE when the emission areas SEA in the at least one sub-display area SBDA are arranged with greater widths than the emission areas MEA (see FIG. 5) in the main display area MDA, the sub-anode initialization voltage may be set to a lower level than the main anode initialization voltage.

The sub-anode initialization voltage line SVAIL may extend in the first direction DR1 and may be disposed to bypass the light transmission areas TRSA. In other words, the sub-anode initialization voltage lines SVAIL are not provided in the light transmission areas TRSA.

According to the embodiments, the circuit layer 120 may further include the sub-anode initialization voltage supply line SAISPL disposed in the non-display area NDA and for transmitting the sub-anode initialization voltage.

According to the embodiments, the circuit layer 120 may further include a sub-anode initialization voltage outer line SAIBL extending along the edge of the at least one sub-display area SBDA. Additionally, the circuit layer 120 may include at least one sub-anode initialization voltage connection line SAICNL that electrically connects the sub-anode initialization voltage supply line SAISPL to the sub-anode initialization voltage outer line SAIBL.

The sub-anode initialization voltage outer line SAIBL may be disposed in a closed curve shape in the at least one sub-display area SBDA. In other words, the sub-anode initialization voltage outer line SAIBL may surround the at least one sub-display area SBDA.

The sub-anode initialization voltage outer line SAIBL may help reduce distortion or delay in the sub-anode initialization voltage as it is transmitted to the at least one sub-display area SBDA.

In addition, the sub-anode initialization voltage outer line SAIBL is disposed between the sub-anode initialization voltage line SVAIL and the main anode initialization voltage line MVAIL, ensuring a clear separation between the sub-anode initialization voltage line SVAIL and the main anode initialization voltage line MVAIL.

The at least one sub-anode initialization voltage connection line SAICNL may be disposed in the main display area MDA and may extend to the non-display area NDA.

A first side of the at least one sub-anode initialization voltage connection line SAICNL may be electrically connected to the sub-anode initialization voltage outer line SAIBL.

A second side of the at least one sub-anode initialization voltage connection line SAICNL may be electrically connected to the sub-anode initialization voltage supply line SAISPL.

According to one example, the sub-anode initialization voltage line SVAIL may be electrically connected to the sub-anode initialization voltage outer line SAIBL.

According to the embodiments, the circuit layer 120 may further include a sub-anode initialization voltage transmission line SAITL disposed in the at least one sub-display area SBDA and extending in a direction intersecting the sub-anode initialization voltage line SVAIL.

The sub-anode initialization voltage transmission line SAITL may be electrically connected to the sub-anode initialization voltage outer line SAIBL and the sub-anode initialization voltage line SVAIL. As an example, the sub-anode initialization voltage transmission line SAITL may connect the sub-anode initialization voltage outer line SAIBL to the sub-anode initialization voltage line SVAIL.

When the sub-anode initialization voltage line SVAIL extends in the first direction DR1, the sub-anode initialization voltage transmission line SAITL may be arranged to extend in the second direction DR2 and bypass the light transmission areas TRSA. In this case, the sub-anode initialization voltage transmission lines SAITL do not intersect the light transmission areas TRSA.

Consequently, the sub-anode initialization voltage line SVAIL may be electrically connected to the sub-anode initialization voltage supply line SAISPL through the at least one sub-anode initialization voltage connection line SAICNL, the sub-anode initialization voltage outer line SAIBL, and the sub-anode initialization voltage transmission line SAITL.

As shown in FIG. 7, in the at least one sub-display area SBDA (see FIG. 7), the second emission area SEA2 may have a smaller width compared to the first emission area SEAL and the third emission area SEA3. As a result, the sub-light emitting element SLE in the second emission area SEA2 may be initialized differently from the sub-light emitting element SLE in the first emission area SEA1 or the sub-light emitting element SLE in the third emission area SEA3.

To address this, as shown in FIG. 12, the sub-anode initialization voltage line SVAIL may include a first sub-anode initialization voltage line SVAIL1 and a second sub-anode initialization voltage line SVAIL2.

The first sub-anode initialization voltage line SVAIL1 may transmit a first sub-anode initialization voltage to initialize the sub-light emitting element SLE in the first emission area SEA1 and the sub-light emitting element SLE in the third emission area SEA3.

In other words, the first sub-anode initialization voltage line SVAIL1 may be electrically connected to the first sub-light emitting pixel driver SEPD1 and the third sub-light emitting pixel driver SEPD3.

The second sub-anode initialization voltage line SVAIL2 may transmit a second sub-anode initialization voltage to initialize the sub-light emitting element SLE in the second emission area SEA2.

In other words, the second sub-anode initialization voltage line SVAIL2 may be electrically connected to the second sub-light emitting pixel driver SEPD2.

The second sub-anode initialization voltage may have a different voltage level compared to the first sub-anode initialization voltage. For example, the second sub-anode initialization voltage may be set at a higher voltage level than the first sub-anode initialization voltage.

In addition, the sub-anode initialization voltage supply line SAISPL may include a first sub-anode initialization voltage supply line SAISPL1 for transmitting the first sub-anode initialization voltage and a second sub-anode initialization voltage supply line SAISPL2 for transmitting the second sub-anode initialization voltage. The first sub-anode initialization voltage supply line SAISPL1 and the second sub-anode initialization voltage supply line SAISPL2 may be adjacent to each other and the second sub-anode initialization voltage supply line SAISPL2 may be adjacent to the second power supply line VSSPL.

The sub-anode initialization voltage outer line SAIBL may include a first sub-anode initialization voltage outer line SAIBL1 and a second sub-anode initialization voltage outer line SAIBL2.

The at least one sub-anode initialization voltage connection line SAICNL may include at least one first sub-anode initialization voltage connection line SAICNL1 and at least one second sub-anode initialization voltage connection line SAICNL2.

The first sub-anode initialization voltage outer line SAIBL1 may be electrically connected to the first sub-anode initialization voltage supply line SAISPL1 through the at least one first sub-anode initialization voltage connection line SAICNL1.

The second sub-anode initialization voltage outer line SAIBL2 may be electrically connected to the second sub-anode initialization voltage supply line SAISPL2 through the at least one second sub-anode initialization voltage connection line SAICNL2.

The sub-anode initialization voltage transmission line SAITL may include a first sub-anode initialization voltage transmission line SAITL1 and a second sub-anode initialization voltage transmission line SAITL2.

The first sub-anode initialization voltage transmission line SAITL1 may be electrically connected to the first sub-anode initialization voltage outer line SAIBL1 and the first sub-anode initialization voltage line SVAIL1.

The second sub-anode initialization voltage transmission line SAITL2 may be electrically connected to the second sub-anode initialization voltage outer line SAIBL2 and the second sub-anode initialization voltage line SVAIL2.

As described above, according to the embodiments, the circuit layer includes the sub-anode initialization voltage line SVAIL and the sub-anode initialization voltage supply line SAISPL in addition to the main anode initialization voltage line MVAIL and the main anode initialization voltage supply line MAISPL. This configuration allows the sub-light emitting elements SLE disposed in the at least one sub-display area SBDA to be initialized with the sub-anode initialization voltage that is different from the main anode initialization voltage.

Consequently, even if the sub-light emitting elements SLE in the at least one sub-display area SBDA are designed with sizes different from the main light emitting elements MLE in the main display area MDA, the visual distinction between the sub-light emitting elements SLE and the main light emitting elements MLE can be reduced. This improvement enhances the display quality of the display device 100, including the at least one sub-display area SBDA.

Figure 13:
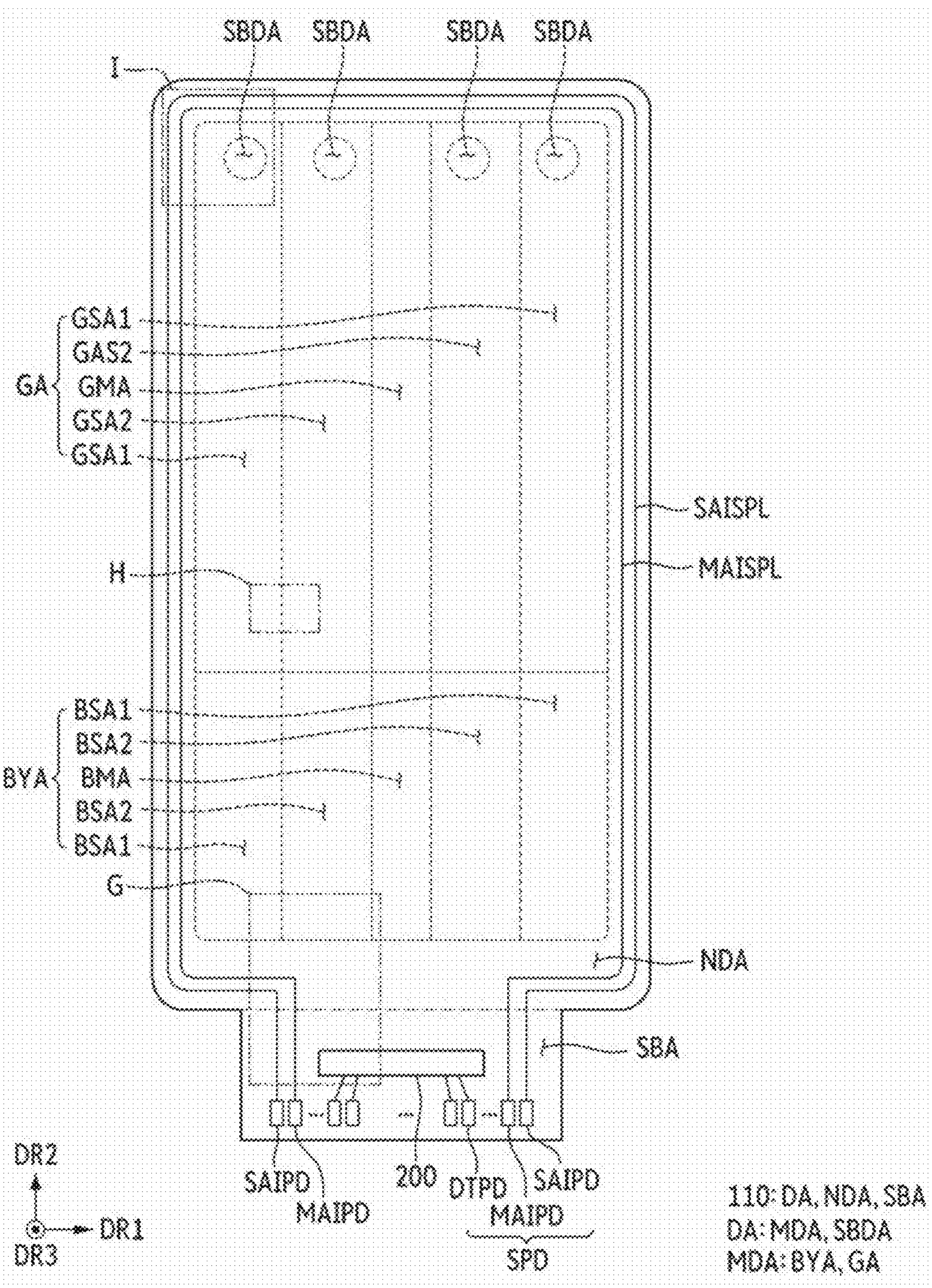
FIG. 13 is a plan view showing the display device of FIG. 2 according to other embodiments.

FIG. 13 is a plan view showing the display device of FIG. 2 according to other embodiments.

Referring to FIG. 13, the display device 100 according to other embodiments is substantially the same as the display device 100 according to the embodiments of FIG. 3 except that the main display area MDA of the substrate 110 includes a bypass area BYA and a general area GA, and thus redundant descriptions will be omitted below.

According to other embodiments, the main display area MDA may include the bypass area BYA disposed on one side adjacent to the sub-region SBA, and the general area GA occupying the remaining area outside the bypass area BYA.

The bypass area BYA includes a bypass middle area BMA disposed at the center of the bypass area BYA in the first direction DR1, a first bypass side area BSA1 parallel to the bypass middle area BMA in the first direction DR1 and in contact with the non-display area NDA, and a second bypass side area BSA2 disposed between the bypass middle area BMA and the first bypass side area BSA1.

The first bypass side area BSA1 may be positioned closer to the bent corner of the substrate 110 compared to the bypass middle area BMA and the second bypass side area BSA2.

The first bypass side area BSA1 and the second bypass side area BSA2 may be disposed between the bypass middle area BMA and the non-display area NDA on both sides of the bypass middle area BMA along the first direction DR1.

The general area GA may include a general middle area GMA connected to the bypass middle area BMA of the bypass area BYA in the second direction DR2, a first general side area GSA1 connected to the first bypass side area BSA1 of the bypass area BYA in the second direction DR2, and a second general side area GSA2 connected to the second bypass side area BSA2 of the bypass area BYA in the second direction DR2.

Figure 14:
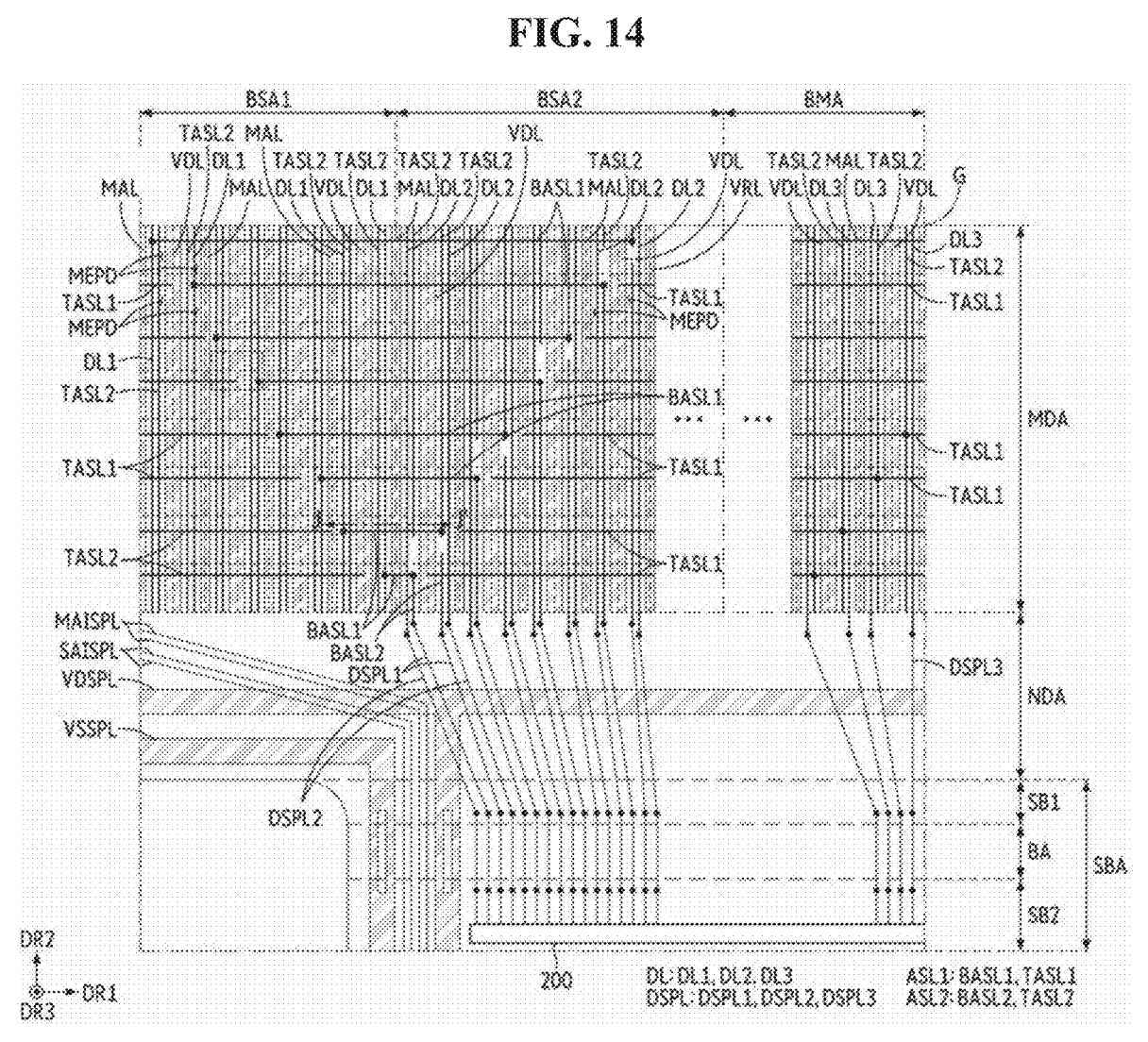
Figure 15:
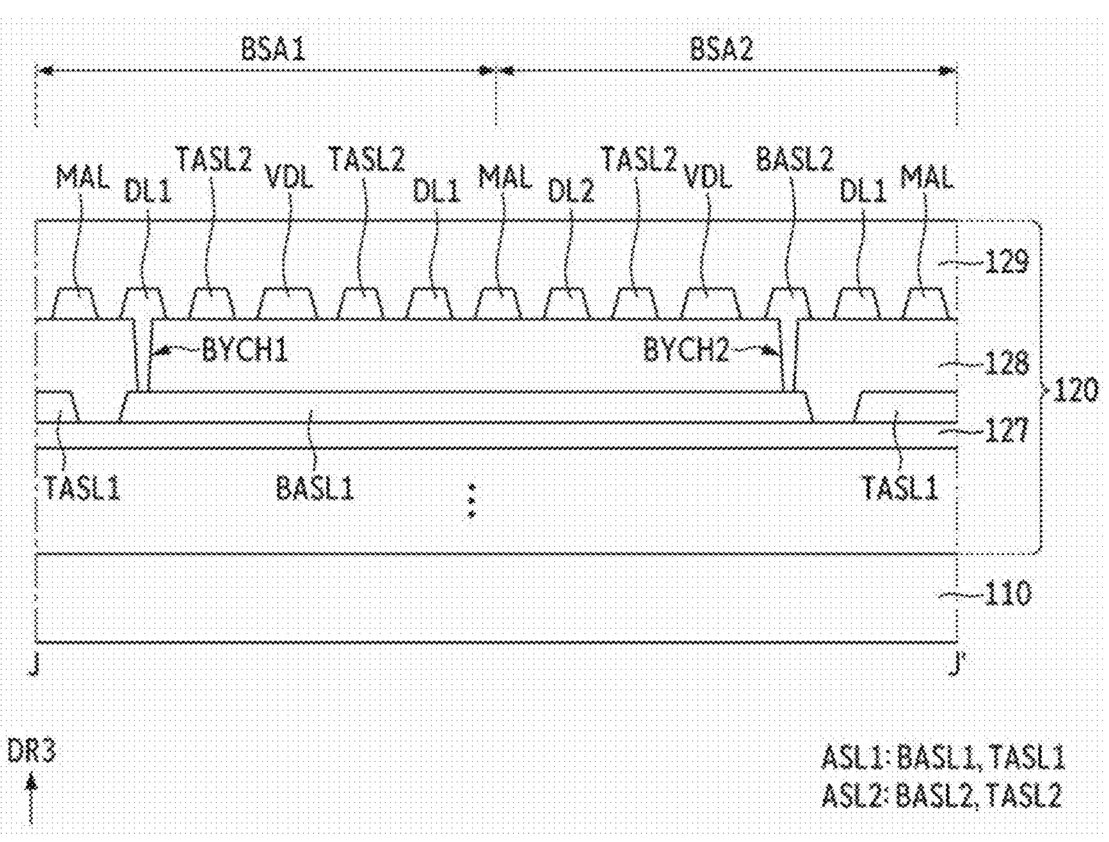
FIG. 15 is a cross-sectional view taken along line J-J' of FIG. 14.

FIG. 14 is a layout diagram illustrating part G of FIG. 13. FIG. 15 is a cross-sectional view taken along line J-J' of FIG. 14.

Referring to FIG. 14, the circuit layer 120 of the display device 100 according to other embodiments may further include data lines DL for transmitting the data signal Vdata (see FIG. 9), first auxiliary lines ASL1 extending in the first direction DR1 intersecting the data lines DL, and second auxiliary lines ASL2 extending in the second direction DR2 parallel to the data lines DL and adjacent to the data lines DL.

The data lines DL may extend in the second direction DR2.

The data lines DL may include a first data line DL1 disposed in the first bypass side area BSA1 and the first general side area GSA1 and a second data line DL2 disposed in the second bypass side area BSA2 and the second general side area GSA2.

According to embodiments, the circuit layer 120 may further include data supply lines DSPL disposed in the non-display area NDA and electrically connected to the display driving circuit 200.

The data supply lines DSPL may extend to the bypass middle area BMA and the second bypass side area BSA2.

The data supply lines DSPL may include a first data supply line DSPL1 that transmits the data signal of the first data line DL1, and a second data supply line DSPL2 that transmits the data signal of the second data line DL2.

The first auxiliary lines ASL1 may include a first data bypass line BASL1 electrically connected to the first data line DL1.

The second auxiliary lines ASL2 may include a second data bypass line BASL2 electrically connected to the first data bypass line BASL1.

The first data supply line DSPL1 may extend to the second data bypass line BASL2 of the second bypass side area BSA2, and may be electrically connected to the first data line DL1 through the second data bypass line BASL2 and the first data bypass line BASL1.

On the other hand, the second data supply line DSPL2 may extend to the second bypass side area BSA2, and may be directly electrically connected to the second data line DL2.

By designing the first data supply line DSPL1 to extend not to the first data line DL1 of the first bypass side area BSA1 but instead to the second data bypass line BASL2 of the second bypass side area BSA2, the extension length of the first data supply line DSPL1 can be shortened. As a result, the area required for arranging the data supply lines DSPL is reduced, thereby decreasing the width of the non-display area NDA.

In addition, since the data supply lines DSPL are not arranged in the portion of the non-display area NDA adjacent to the bent edge of the substrate 110, the width of the non-display area NDA may be further reduced.

The data lines DL may further include a third data line DL3 disposed in the bypass middle area BMA. In addition, the data supply lines DSPL may further include a third data supply line DSPL3 that transmits the data signal of the third data line DL3.

The third data supply line DSPL3 may extend to the bypass middle area BMA, and may be directly electrically connected to the third data line DL3.

The first data bypass line BASL1 may be disposed between the first data line DL1 and the second data bypass line BASL2.

The second data bypass line BASL2 may be disposed between the first data supply line DSPL1 and the first data bypass line BASL1 in the non-display area NDA.

By limiting the arrangement of the first data bypass line BASL1 and the second data bypass line BASL2 to the bypass area BYA, the ends of the first data bypass line BASL1 and the ends of the second data bypass line BASL2 are arranged in an orderly manner. However, the can increase the visibility of the first data bypass line BASL1 and the second data bypass line BASL2.

To address this, the first auxiliary lines ASL1 may include not only the first data bypass line BASL1 but also additional first transmission auxiliary lines TASL1. Similarly, the second auxiliary lines ASL2 may include not only the second data bypass line BASL2 but also additional second transmission auxiliary lines TASL2.

Two of the first transmission auxiliary lines TASL1 may extend to the non-display area NDA at both ends of the first data bypass line BASL1.

One of the second transmission auxiliary lines TASL2 may extend from one end of the second data bypass line BASL2 to the non-display area NDA in a direction away from the sub-region SBA.

Since the second data bypass line BASL2 is disposed only in the second bypass side area BSA2, the first data line DL1 in the first bypass side area BSA1 may be entirely adjacent to the second transmission auxiliary line TASL2.

Each of the first and second transmission auxiliary lines TASL1 and TASL2 may transmit one of the second power source ELVSS (see FIG. 9), the gate initialization voltage VINT (see FIG. 9), the anode initialization voltage VAINT (see FIG. 9), and the bias voltage VBS (see FIG. 9). Among the first and second transmission auxiliary lines TASL1 and TASL2, those intersecting the sub-display area SBDA may be configured to transmit the sub-anode initialization voltage or the main anode initialization voltage.

The third data line DL3 of the bypass middle area BMA may be entirely adjacent to the second transmission auxiliary line TASL2.

In accordance with embodiments, the sub-region SBA may include a bending area BA that is shaped into a bent configuration, a first sub-region SB1 disposed between one side of the main region MA and one side of the bending area BA, and a second sub-region SB2 extending from the other side of the bending area BA.

When the bending area BA is transformed into a bent shape, the second sub-region SB2 may be positioned on the rear surface of the display device 100 and overlap with the main region MA.

The display driving circuit 200 provided as an integrated circuit (IC) chip may be mounted in the second sub-region SB2.

The display circuit board 300 may be bonded to one side of the second sub-region SB2.

According to embodiments, the circuit layer 120 may further include a first power supply line VDSPL for transmitting the first power source ELVDD (see FIG. 9) and a second power supply line VSSPL for transmitting the second power source ELVSS (see FIG. 9).

The first power supply line VDSPL and the second power supply line VSSPL may be provided in the non-display area NDA and may extend to the sub-region SBA.

The first power supply line VDSPL may be electrically connected to a first power pad for transmitting the first power source ELVDD, among the pads SPD (see FIG. 13) disposed in the second sub-region SB2.

The second power supply line VSSPL may be electrically connected to a second power pad for transmitting the second power source ELVSS, among the signal pads SPD disposed in the second sub-region SB2.

According to embodiments, the circuit layer 120 may further include the first power lines VDL for transmitting the first power source ELVDD to the light emitting pixel drivers EPD.

The first power lines VDL may extend in the second direction DR2 and may be electrically connected to the first power supply line VDSPL.

The first power lines VDL may be disposed between two second auxiliary lines ASL2 adjacent to each other in the first direction DR1.

According to embodiments, the circuit layer 120 may further include mesh auxiliary lines MAL extending in the second direction DR2.

Each of the mesh auxiliary lines MAL may transmit one of the second power source ELVSS (see FIG. 9), the gate initialization voltage VINT (see FIG. 9), the anode initialization voltage VAINT (see FIG. 9), and the bias voltage VBS (see FIG. 9). Some of the mesh auxiliary lines MAL may transmit the main anode initialization voltage.

The mesh auxiliary lines MAL may be disposed between two data lines DL adjacent in the first direction DR1.

As shown in FIG. 15, the data lines DL, the second auxiliary lines ASL2, and the first power lines VDL may be disposed on at least one insulating layer (e.g., the second planarization layer 128) covering the first auxiliary lines ASL1 and may be covered with at least another insulating layer (e.g., the third planarization layer 129).

For example, the first auxiliary lines ASL1 may be disposed in the first source-drain conductive layer above the second interlayer insulating layer 126. In addition, the data lines DL, the second auxiliary lines ASL2, and the first power lines VDL may be disposed in the second source-drain conductive layer above the first planarization layer 127.

The first data bypass line BASL1 may be electrically connected to the first data line DL1 through a first bypass connection hole BYCH1, and may be electrically connected to the second data bypass line BASL2 through a second bypass connection hole BYCH2.

Each of the first bypass connection hole BYCH1 and the second bypass connection hole BYCH2 may penetrate at least one insulating layer (e.g., the second planarization layer 128) covering the first auxiliary lines ASL1.

Figure 16:
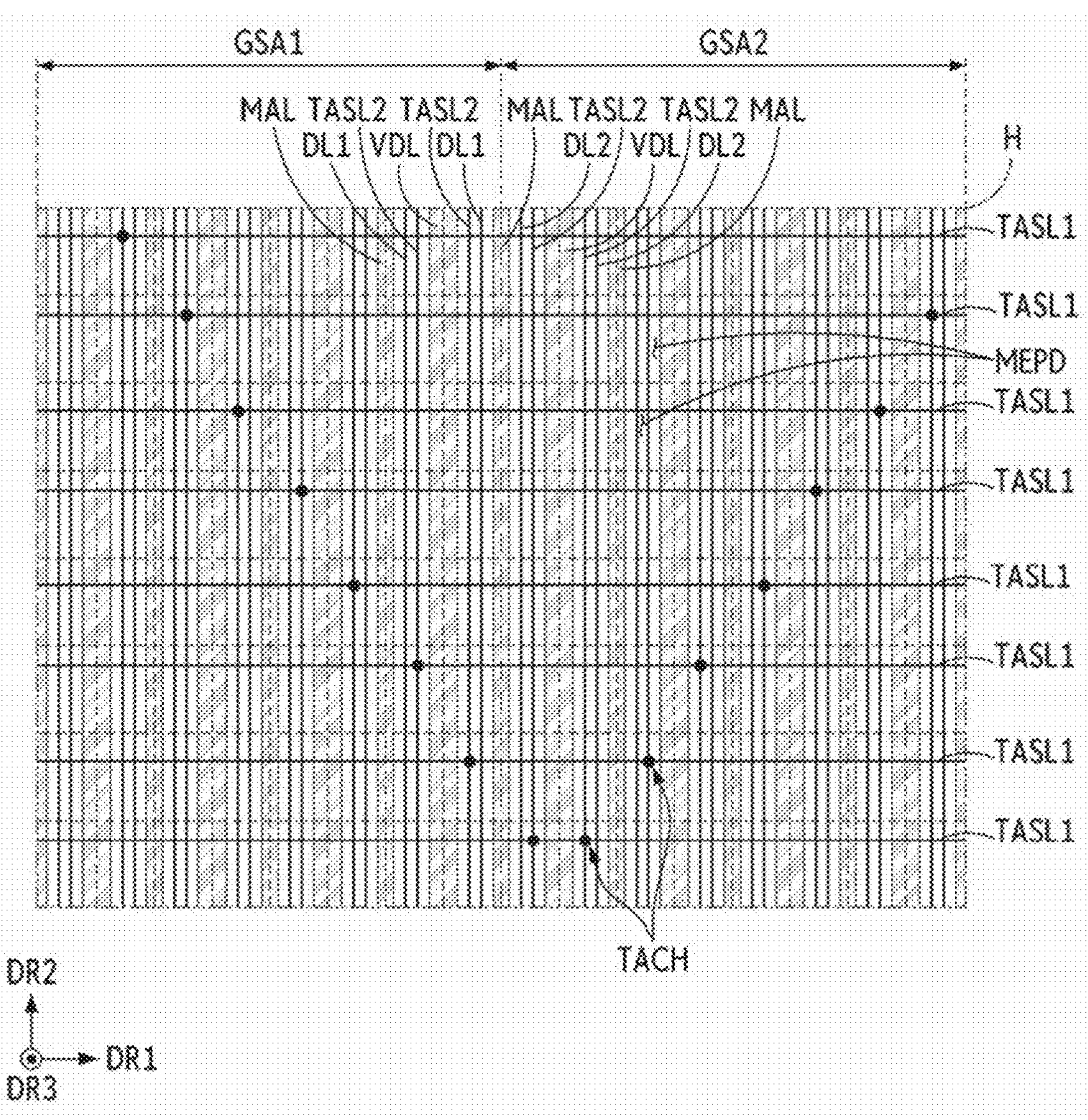
FIG. 16 is a layout diagram illustrating part H of FIG. 13.

As shown in FIG. 16, the first transmission auxiliary lines TASL1 of the first auxiliary lines ASL1 and the second transmission auxiliary lines TASL2 of the second auxiliary lines ASL2 may be disposed in the general area GA.

At least some of the first transmission auxiliary lines TASL1 and at least some of the second transmission auxiliary lines TASL2 may be electrically connected to each other through transmission auxiliary connection holes TACH.

Figure 17:
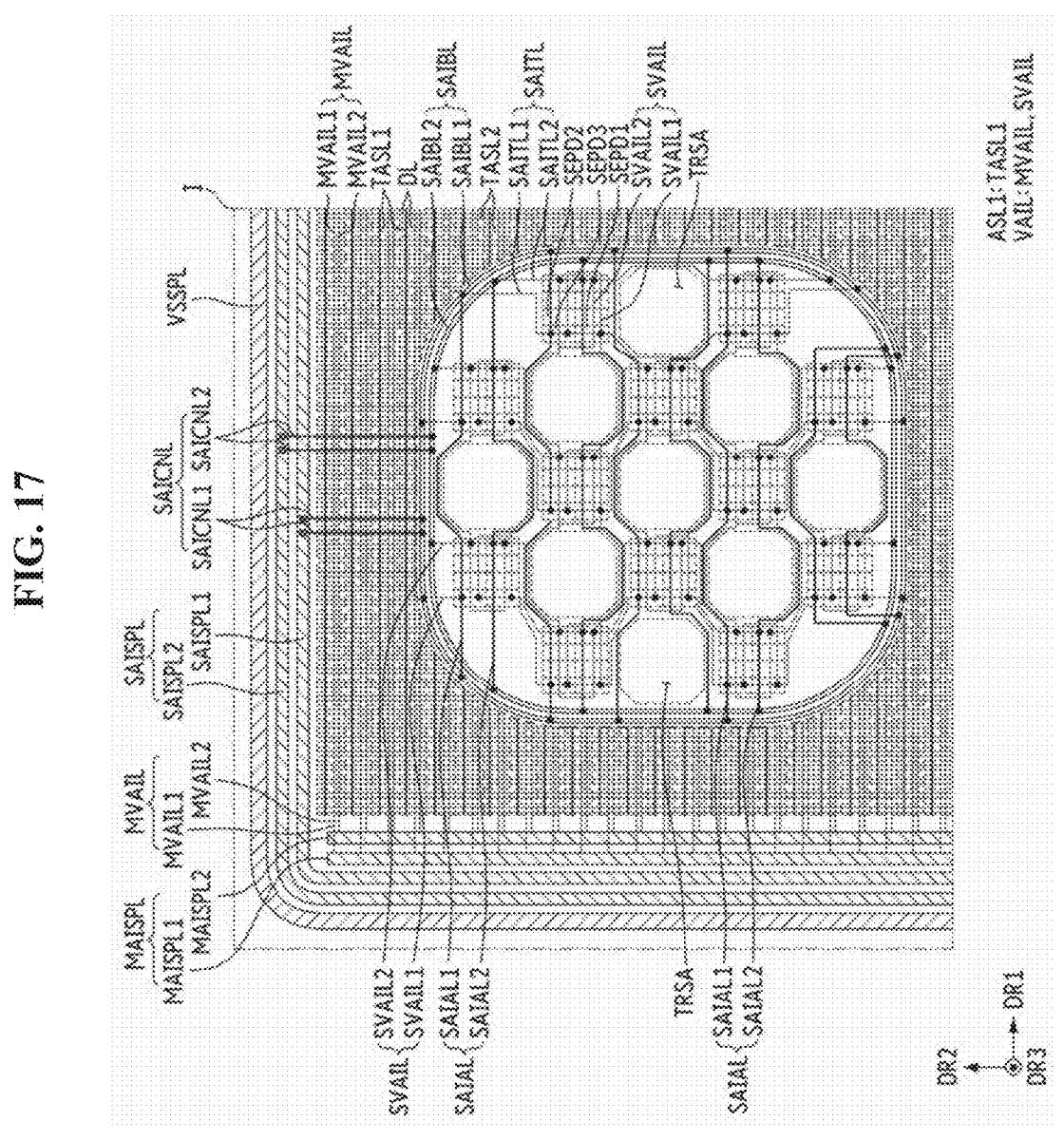
Figure 18:
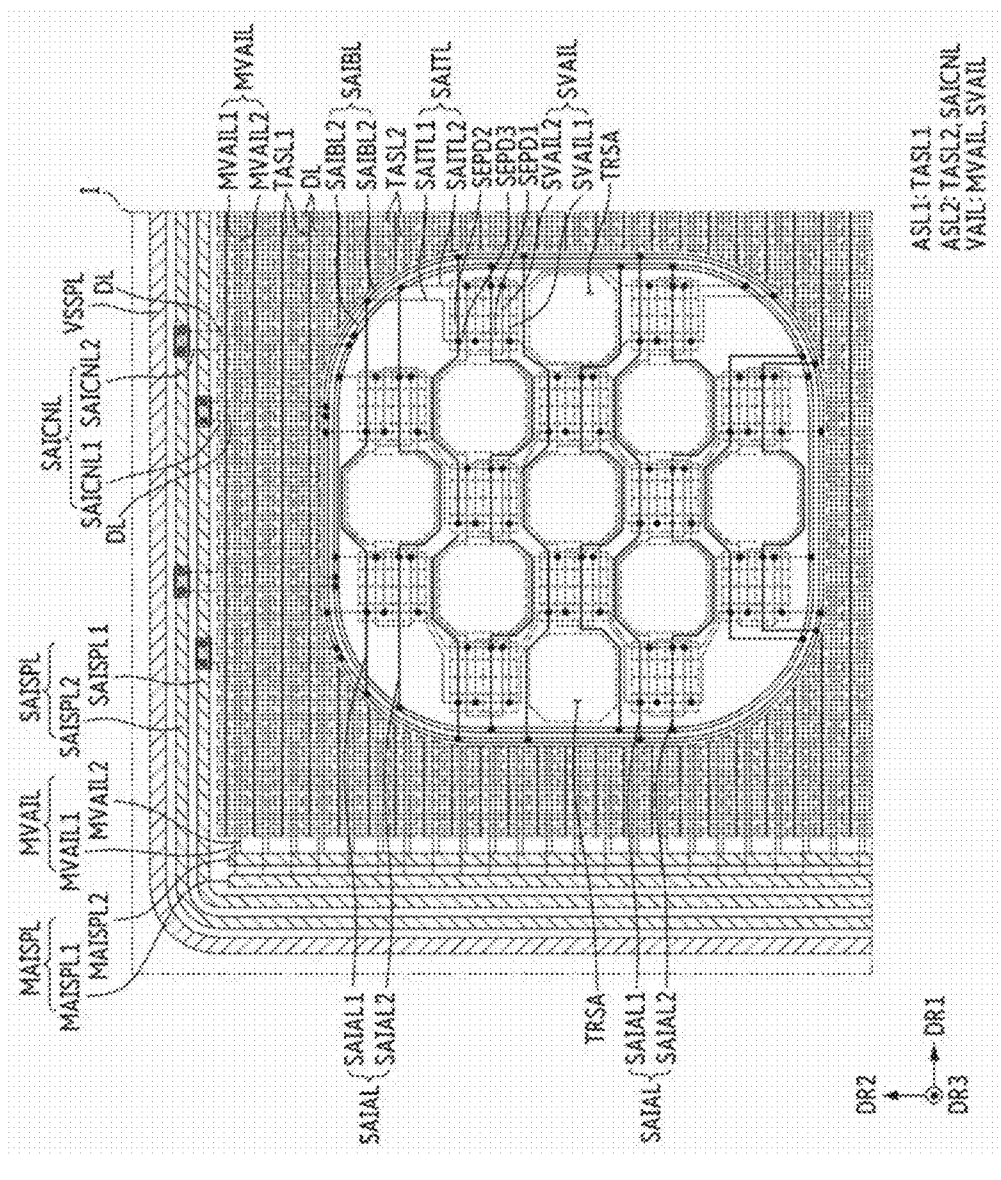
Figure 19:
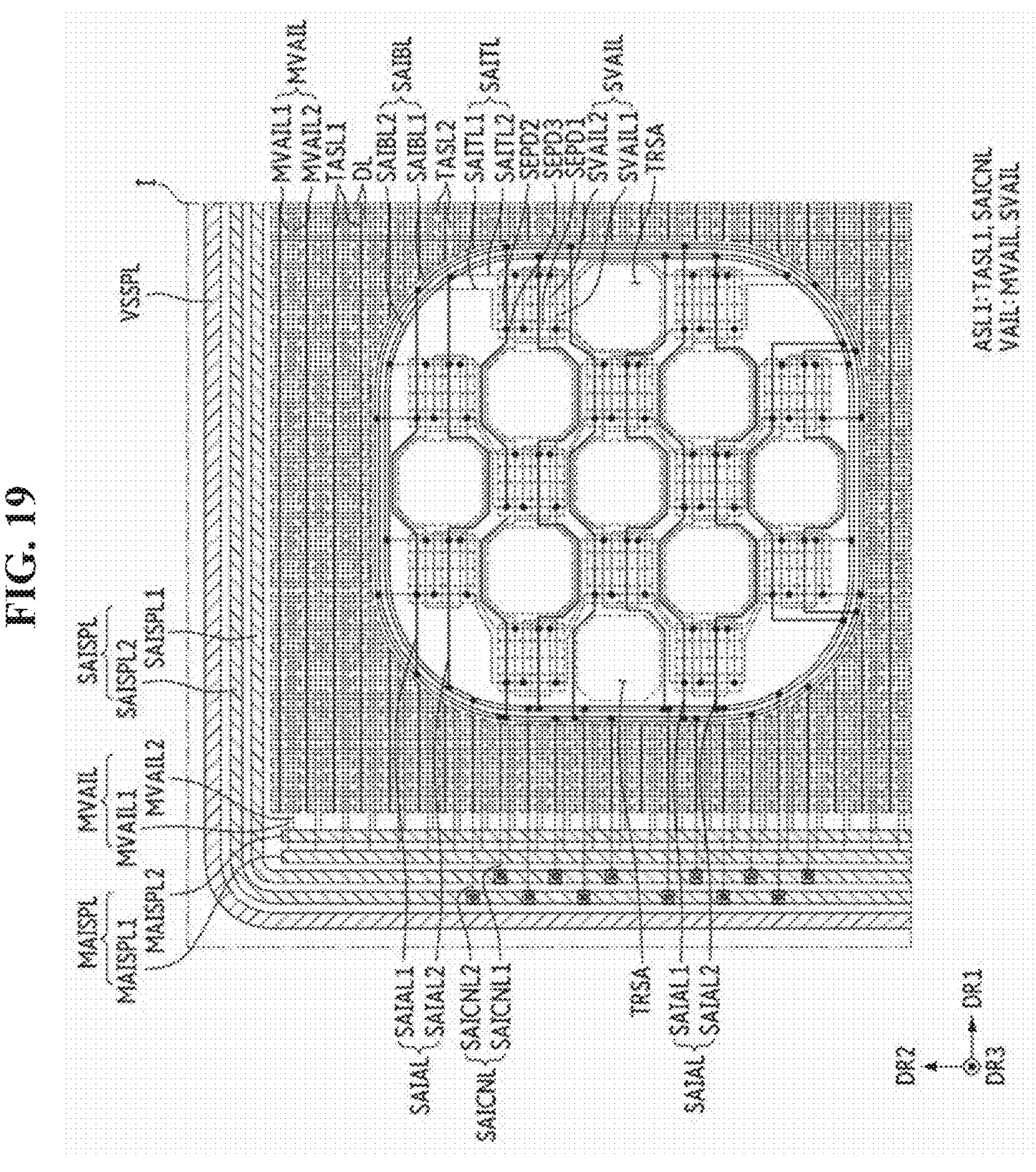

FIGS. 17, 18, and 19 are layout diagrams illustrating part I of FIG. 13 according to other embodiments.

As shown in FIG. 17, the display device 100 according to another embodiment is substantially the same as the display device 100 of the embodiments shown in FIGS. 1 to 12 except that it further includes a sub-anode initialization voltage additional line SAIAL disposed in the at least one sub-display area SBDA and extending in a direction intersecting the sub-anode initialization voltage transmission line SAITL, and thus redundant descriptions will be omitted below.

In this way, the sub-anode initialization voltage may be transmitted to the at least one sub-display area SBDA through a mesh-shaped wiring formed with the sub-anode initialization voltage transmission line SAITL and the sub-anode initialization voltage additional line SAIAL.

Therefore, distortion or delay of the sub-anode initialization voltage may be reduced.

According to another embodiment of FIG. 17, the first auxiliary lines ASL1 may include the sub-anode initialization voltage additional line SAIAL.

In other words, the sub-anode initialization voltage additional line SAIAL may be configured as a portion of at least one of the first auxiliary lines ASL1 that overlaps with the sub-display area SBDA.

In this manner, the potential deterioration of resolution in the at least one sub-display area SBDA caused by the arrangement of the sub-anode initialization voltage additional line SAIAL may be reduced or prevented.

According to another embodiment of FIG. 17, the sub-anode initialization voltage additional line SAIAL may include a first sub-anode initialization voltage additional line SAIAL1 electrically connected to the first sub-anode initialization voltage outer line SAIBL1 and the first sub-anode initialization voltage transmission line SAITL1 and a second sub-anode initialization voltage additional line SAIAL2 electrically connected to the second sub-anode initialization voltage outer line SAIBL2 and the second sub-anode initialization voltage transmission line SAITL2.

The display device 100 of still another embodiment shown in FIG. 18 is substantially the same as the display device 100 of another embodiment shown in FIG. 17 except that the second auxiliary lines ASL2 include the at least one sub-anode initialization voltage connection line SAICNL, and thus redundant descriptions will be omitted below.

As shown in FIG. 18, some of the second auxiliary lines ASL2 intersecting the at least one sub-display area SBDA may be the at least one sub-anode initialization voltage connection line SAICNL extending to the non-display area NDA and electrically connecting the sub-anode initialization voltage supply line SAISPL to the sub-anode initialization voltage outer line SAIBL.

The display device 100 of still another embodiment shown in FIG. 19 is substantially the same as another embodiment shown in FIG. 17 except that the first auxiliary lines ASL1 include the at least one sub-anode initialization voltage connection line SAICNL, and thus redundant descriptions will be omitted below.

As shown in FIG. 19, some of the first auxiliary lines ASL1, which intersect the at least one sub-display area SBDA, may be the at least one sub-anode initialization voltage connection line SAICNL extending to the non-display area NDA and electrically connecting the sub-anode initialization voltage supply line SAISPL to the sub-anode initialization voltage outer line SAIBL.

As described above, according to the other embodiments shown in FIGS. 18 and 19, the sub-anode initialization voltage connection line SAICNL is configured as part of the first auxiliary lines ASL1 or the second auxiliary lines ASL2. This arrangement helps reduce or prevent the deterioration of resolution in the main display area MDA caused by the inclusion of the sub-anode initialization voltage connection line SAICNL.

However, the effects of the present disclosure are not limited to the one set forth herein. Additional effects and benefits will be apparent to those of ordinary skill in the art upon reviewing the claims of the present disclosure.

What is claimed is:

1. A display device comprising:

a substrate comprising a display area comprising emission areas and a non-display area disposed around the display area;

a circuit layer disposed on the substrate; and an element layer disposed on the circuit layer, wherein the display area comprises a main display area in which the emission areas are arranged side by side, and at least one sub-display area surrounded by the main display area, each of the at least one sub-display area further comprises light transmission areas disposed between the emission areas, the element layer comprises:

main light emitting elements disposed in the emission areas of the main display area; and sub-light emitting elements disposed in the emission areas of the at least one sub-display area, and the circuit layer comprises:

main light emitting pixel drivers electrically connected to the main light emitting elements;

sub-light emitting pixel drivers electrically connected to the sub-light emitting elements;

a main anode initialization voltage line disposed in the main display area and configured to transmit a main anode initialization voltage for initializing the main light emitting elements; and a sub-anode initialization voltage line disposed in the at least one sub-display area and configured to transmit a sub-anode initialization voltage for initializing the sub-light emitting elements, the sub-anode initialization voltage line comprising a first sub-anode initialization voltage line transmitting a first sub-anode initialization voltage to a first plurality of sub-light emitting elements and a second sub-anode initialization voltage line transmitting a second sub-anode initialization voltage to a second plurality of sub-light emitting elements not including any of the first plurality of sub-light emitting elements, wherein the first sub-anode initialization voltage and the second sub-anode initialization voltage have a different voltage level from each other.

2. The display device of claim 1, wherein the sub-anode initialization voltage has a voltage level different from the main anode initialization voltage.

3. The display device of claim 2, wherein a width of each of the sub-light emitting elements is greater than a width of each of the main light emitting elements, and the sub-anode initialization voltage has a voltage level lower than the main anode initialization voltage.

4. The display device of claim 2, wherein the circuit layer further comprises:

a main anode initialization voltage supply line disposed in the non-display area and electrically connected to the main anode initialization voltage line; and a sub-anode initialization voltage supply line disposed in the non-display area and configured to transmit the sub-anode initialization voltage.

5. The display device of claim 4, wherein the circuit layer further comprises:

a sub-anode initialization voltage outer line extending along an edge of the at least one sub-display area; and at least one sub-anode initialization voltage connection line electrically connecting the sub-anode initialization voltage supply line to the sub-anode initialization voltage outer line.

6. The display device of claim 5, wherein the circuit layer further comprises:

a sub-anode initialization voltage transmission line disposed in the at least one sub-display area, extending in a direction intersecting the sub-anode initialization voltage line, and electrically connecting the sub-anode initialization voltage outer line and the sub-anode initialization voltage line to each other, the sub-anode initialization voltage line is directly connected to the sub-light emitting elements.

7. The display device of claim 6, wherein the circuit layer further comprises:

a sub-anode initialization voltage additional line disposed in the at least one sub-display area, extending in a direction intersecting the sub-anode initialization voltage transmission line, and electrically connected to the sub-anode initialization voltage transmission line.

8. The display device of claim 7, wherein the circuit layer further comprises:

data lines for transmitting a data signal;

first auxiliary lines extending in a first direction intersecting the data lines; and second auxiliary lines extending in a second direction parallel to the data lines and adjacent to the data lines, wherein the first auxiliary lines comprise the sub-anode initialization voltage additional line.

9. The display device of claim 8, wherein the second auxiliary lines comprise the at least one sub-anode initialization voltage connection line.

10. The display device of claim 8, wherein the first auxiliary lines further comprise the at least one sub-anode initialization voltage connection line.

11. The display device of claim 8, further comprising a display driving circuit for outputting data signals of the data lines, wherein a bypass area on one side of the main display area comprises a bypass middle area, a first bypass side area parallel to the bypass middle area in the first direction and adjacent to the non-display area, and a second bypass side area disposed between the bypass middle area and the first bypass side area, the circuit layer further comprises data supply lines disposed in the non-display area, extending to the bypass middle area or the second bypass side area, and electrically connected to the display driving circuit, the data lines comprise a first data line disposed in the first bypass side area, and a second data line disposed in the second bypass side area, the first auxiliary lines further comprise a first data bypass line electrically connected to the first data line, the second auxiliary lines comprise a second data bypass line adjacent to the second data line and electrically connected to the first data bypass line, a first data supply line, which transmits a data signal of the first data line among the data supply lines, is electrically connected to the first data line through the first data bypass line and the second data bypass line, and a second data supply line, which transmits a data signal of the second data line among the data supply lines, is directly electrically connected to the second data line.

12. The display device of claim 2, wherein one of the main light emitting pixel drivers is electrically connected to one of the main light emitting elements, and the one main light emitting pixel driver comprises:

a first transistor for generating a driving current;

a second transistor electrically connected between a data line for transmitting a data signal and a first electrode of the first transistor;

a third transistor electrically connected between a gate electrode of the first transistor and a second electrode of the first transistor;

a fourth transistor electrically connected between a gate initialization voltage line for transmitting a gate initialization voltage and the gate electrode of the first transistor;

a fifth transistor electrically connected between a first power line for transmitting a first power source and the first electrode of the first transistor;

a sixth transistor electrically connected between the second electrode of the first transistor and the one main light emitting element;

a seventh transistor electrically connected between the main anode initialization voltage line and the one main light emitting element; and an eighth transistor electrically connected between a bias voltage line for transmitting a bias voltage and the first electrode of the first transistor.

13. The display device of claim 2, wherein one of the sub-light emitting pixel drivers is electrically connected to one of the sub-light emitting elements, and the one sub-light emitting pixel driver comprises:

a first transistor for generating a driving current;

a second transistor electrically connected between a data line for transmitting a data signal and a first electrode of the first transistor;

a third transistor electrically connected between a gate electrode of the first transistor and a second electrode of the first transistor;

a fourth transistor electrically connected between a gate initialization voltage line for transmitting a gate initialization voltage and the gate electrode of the first transistor;

a fifth transistor electrically connected between a first power line for transmitting a first power source and the first electrode of the first transistor;

a sixth transistor electrically connected between the second electrode of the first transistor and the one sub-light emitting element;

a seventh transistor electrically connected between the sub-anode initialization voltage line and the one sub-light emitting element; and an eighth transistor electrically connected between a bias voltage line for transmitting a bias voltage and the first electrode of the first transistor.

14. The display device of claim 2, wherein the emission areas comprise:

first emission areas for emitting light in a first wavelength band;

second emission areas for emitting light in a second wavelength band lower than the first wavelength band; and third emission areas for emitting light in a third wavelength band lower than the second wavelength band, the main anode initialization voltage line comprises:

a first main anode initialization voltage line configured to transmit a first main anode initialization voltage for initializing the main light emitting elements of the first emission areas and the main light emitting elements of the third emission areas; and a second main anode initialization voltage line configured to transmit a second main anode initialization voltage for initializing the main light emitting elements of the second emission areas, and the sub-anode initialization voltage line comprises:

the first sub-anode initialization voltage line configured to transmit the first sub-anode initialization voltage for initializing the sub-light emitting elements of the first emission areas and the sub-light emitting element of the third emission areas; and the second sub-anode initialization voltage line configured to transmit the second sub-anode initialization voltage for initializing the sub-light emitting elements of the second emission areas.

15. An electronic device, comprising:

a display device comprising:

a substrate comprising a display area comprising emission areas and a non-display area disposed around the display area;

a circuit layer disposed on the substrate; and an element layer disposed on the circuit layer, wherein the display area comprises a main display area in which the emission areas are arranged side by side, and at least one sub-display area surrounded by the main display area, each of the at least one sub-display area further comprises light transmission areas disposed between the emission areas, the element layer comprises:

main light emitting elements disposed in the emission areas of the main display area; and sub-light emitting elements disposed in the emission areas of the at least one sub-display area, and the circuit layer comprises:

main light emitting pixel drivers electrically connected to the main light emitting elements;

sub-light emitting pixel drivers electrically connected to the sub-light emitting elements;

a main anode initialization voltage line disposed in the main display area and configured to transmit a main anode initialization voltage for initializing the main light emitting elements; and a sub-anode initialization voltage line disposed in the at least one sub-display area and configured to transmit a sub-anode initialization voltage for initializing the sub-light emitting elements, the sub-anode initialization voltage line comprising a first sub-anode initialization voltage line transmitting a first sub-anode initialization voltage to a first plurality of sub-light emitting elements and a second sub-anode initialization voltage line transmitting a second sub-anode initialization voltage to a second plurality of sub-light emitting elements not including any of the first plurality of sub-light emitting elements, wherein the first sub-anode initialization voltage and the second sub-anode initialization voltage have a different voltage level from each other.

16. The electronic device of claim 15, wherein the sub-anode initialization voltage has a voltage level different from the main anode initialization voltage.

17. The electronic device of claim 16, wherein a width of each of the sub-light emitting elements is greater than a width of each of the main light emitting elements, and the sub-anode initialization voltage has a voltage level lower than the main anode initialization voltage.

18. The electronic device of claim 16, wherein the circuit layer further comprises:

a main anode initialization voltage supply line disposed in the non-display area and electrically connected to the main anode initialization voltage line; and a sub-anode initialization voltage supply line disposed in the non-display area and configured to transmit the sub-anode initialization voltage.

19. The electronic device of claim 18, wherein the circuit layer further comprises:

a sub-anode initialization voltage outer line extending along an edge of the at least one sub-display area; and at least one sub-anode initialization voltage connection line electrically connecting the sub-anode initialization voltage supply line to the sub-anode initialization voltage outer line.

20. The electronic device of claim 19, wherein the circuit layer further comprises:

a sub-anode initialization voltage transmission line disposed in the at least one sub-display area, extending in a direction intersecting the sub-anode initialization voltage line, and electrically connecting the sub-anode initialization voltage outer line and the sub-anode initialization voltage line to each other, the sub-anode initialization voltage line is directly connected to the sub-light emitting elements.

* * * * *